United States Patent [19]
Oowaki et al.

[11] Patent Number: 5,638,329
[45] Date of Patent: Jun. 10, 1997

[54] MOS SEMICONDUCTOR DEVICE WITH MEMORY CELLS EACH HAVING STORAGE CAPACITOR AND TRANSFER TRANSISTOR

[75] Inventors: Yukihito Oowaki, Yokohama; Daisuke Kato; Daisaburo Takashima, both of Kawasaki, all of Japan

[73] Assignee: Kabushiki Kaisha Toshiba, Kawasaki, Japan

[21] Appl. No.: 420,079

[22] Filed: Apr. 11, 1995

Related U.S. Application Data

[63] Continuation of Ser. No. 197,409, Feb. 16, 1994, Pat. No. 5,426,604, which is a continuation of Ser. No. 907,645, Jul. 2, 1992, Pat. No. 5,299,154.

[30] Foreign Application Priority Data

Jul. 2, 1991 [JP] Japan .................... 3-161899

[51] Int. Cl.$^6$ .................................... G11C 7/00
[52] U.S. Cl. ............... 365/189.09; 365/149; 365/230.03; 365/205
[58] Field of Search ................ 365/189.09, 149, 365/189.11, 205, 230.03, 226

[56] References Cited

U.S. PATENT DOCUMENTS 4,907,199  3/1990  Dosaka et al. ............... 305/230.03 X
5,278,786  1/1994  Kawauchi et al. ............ 305/230.03 X

*Primary Examiner*—David C. Nelms
*Assistant Examiner*—Huan Hoang
*Attorney, Agent, or Firm*—Oblon, Spivak, McClelland, Maier & Neustadt, P.C.

[57] ABSTRACT

A MOS dynamic random access memory includes a plurality of pairs of bit lines, and word lines transverse to the bit lines to define cross points, at which an array of memory cells are arranged. Each cell has a storage capacitor and a transfer gate MOS transistor having a gate electrode coupled to a word line and being connected between the capacitor and a bit line. Sense amplifier circuits are connected to the bit line pairs, and have a first and a second common source line. A decoder and a word line driver are connected to the word lines. A MOS transistor is connected between the power supply voltage and the first common source line, for selectively supplying it with a first voltage which potentially defines a high-level voltage for the bit line pairs. A voltage generator is connected through a MOS transistor to the second common source line, for generating a second voltage which potentially defines a low-level voltage for the bit line pairs, and which is selectively supplied to the second common source line. The second voltage is greater in potential than the ground potential, which is employed as a source voltage.

25 Claims, 30 Drawing Sheets

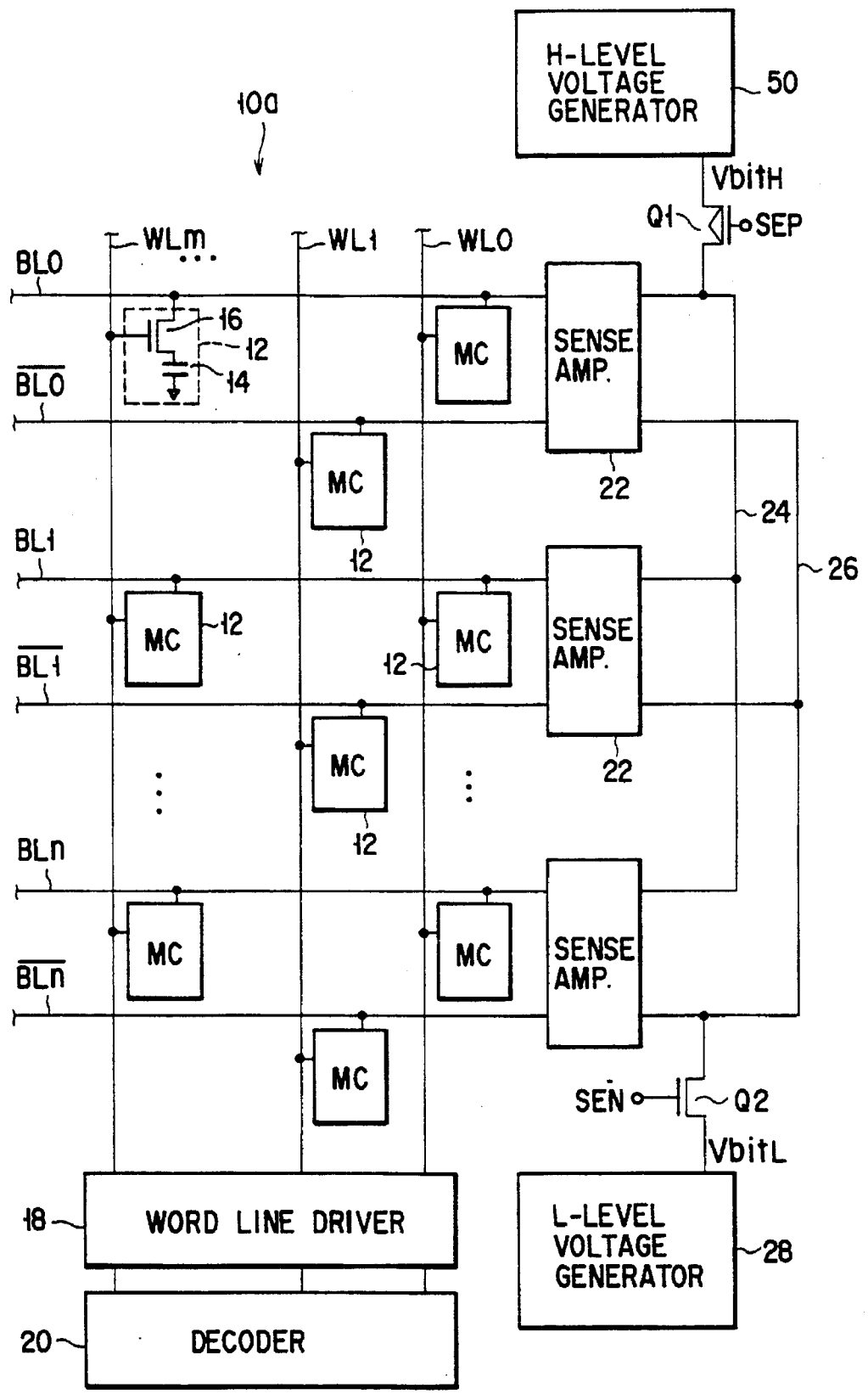
F I G. 7

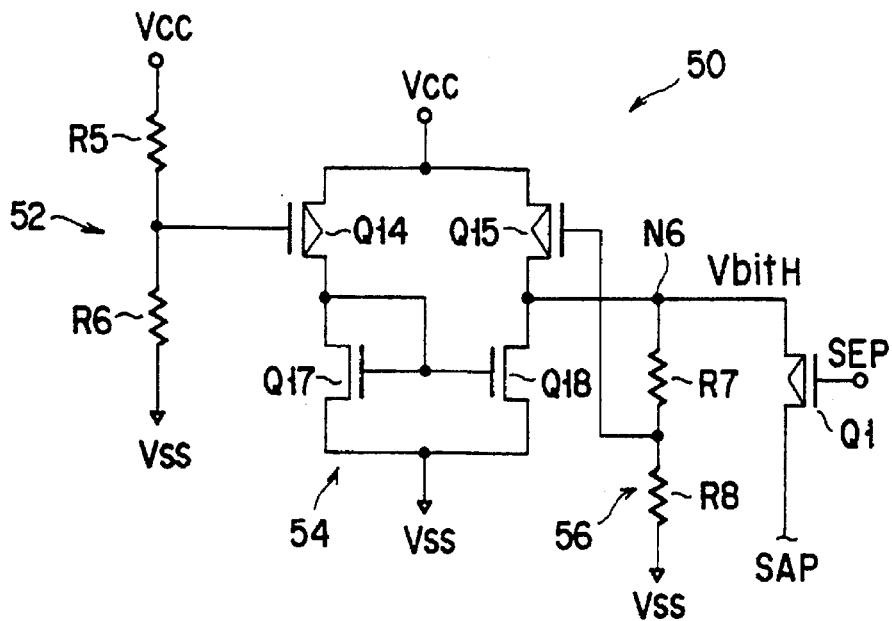
F I G. 8
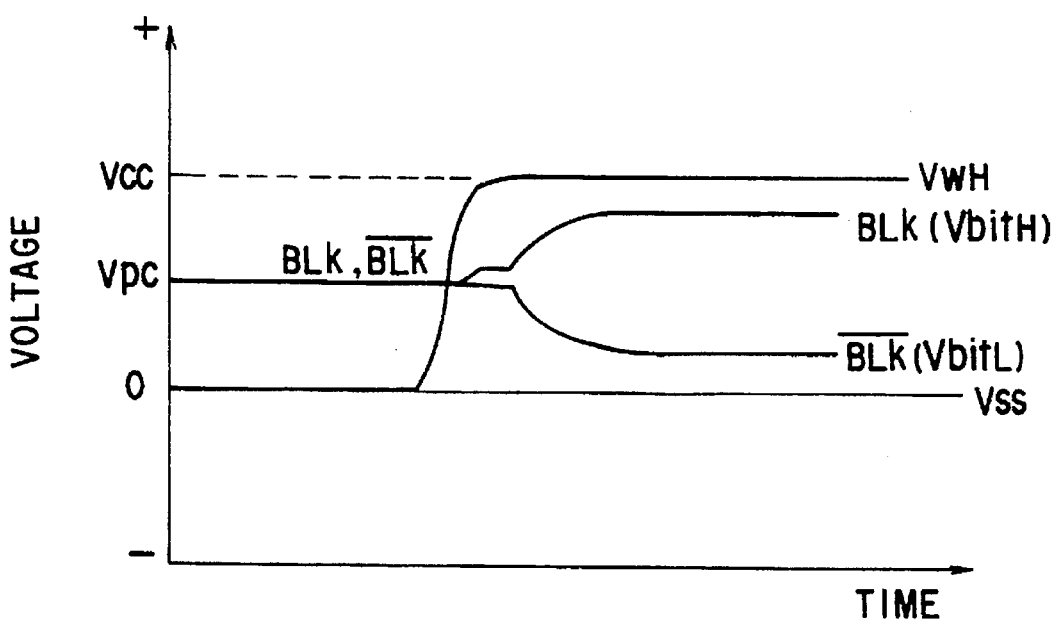
F I G. 9

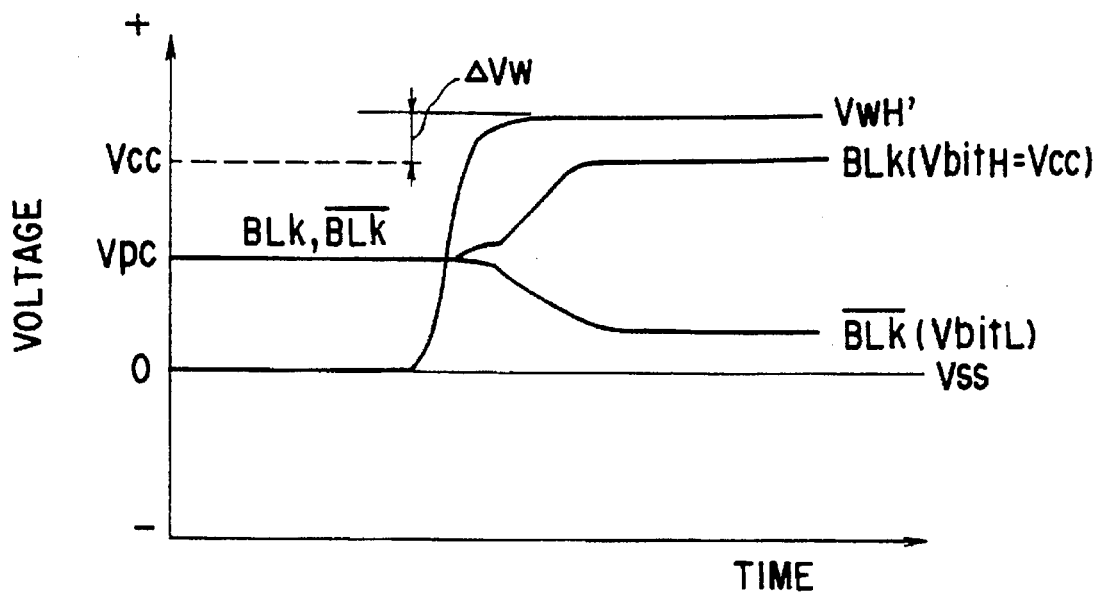
F I G. 10
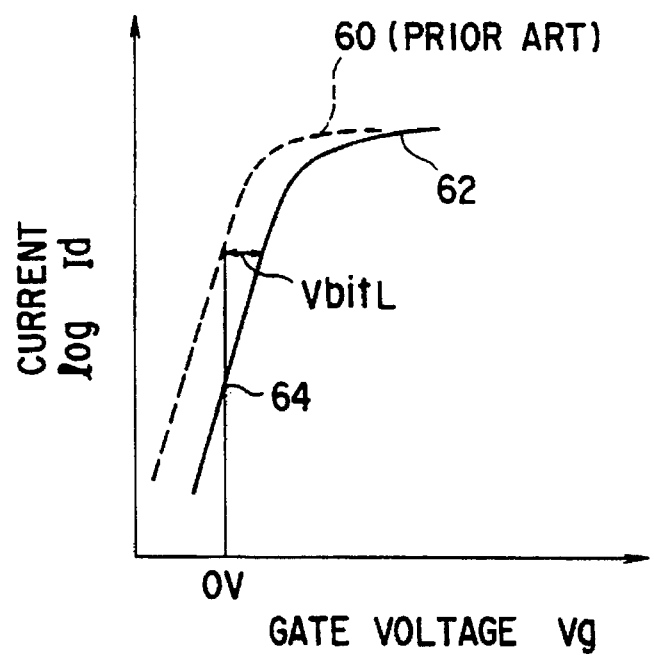
F I G. 11

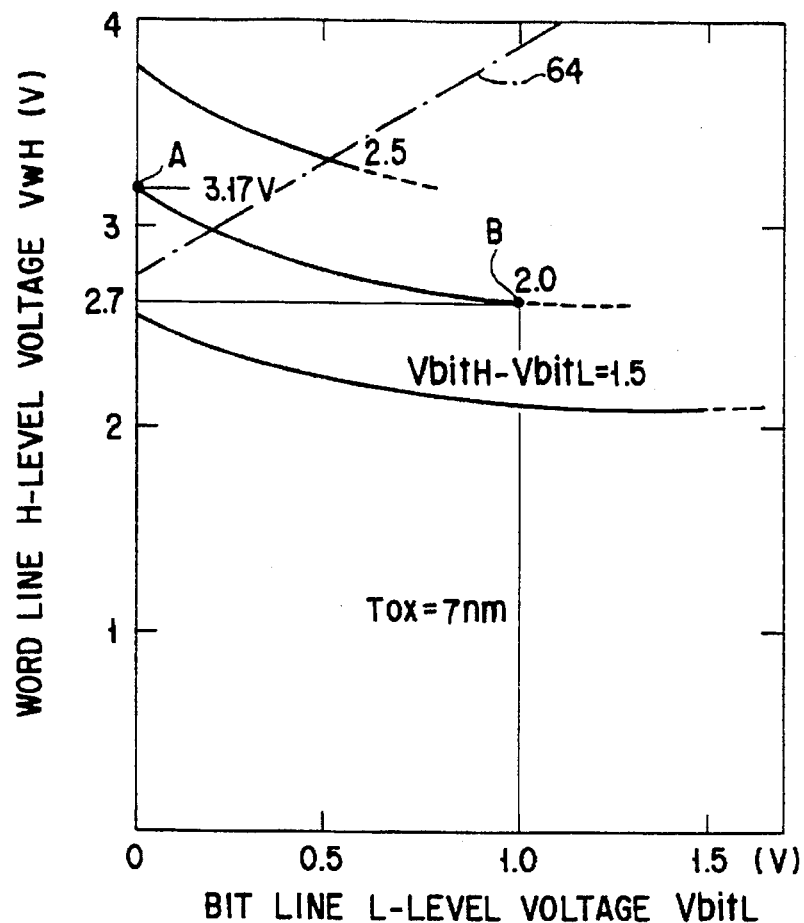
F I G. 12
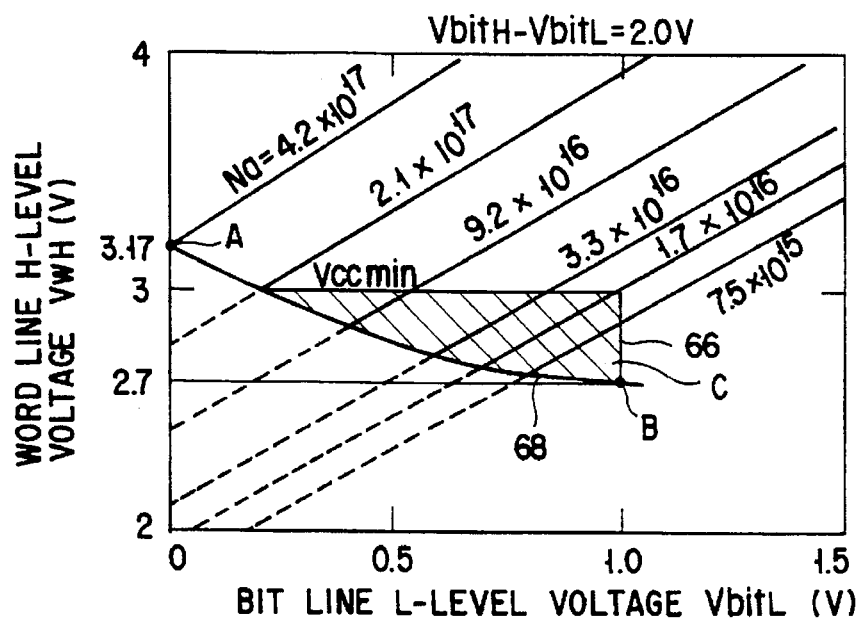
F I G. 13

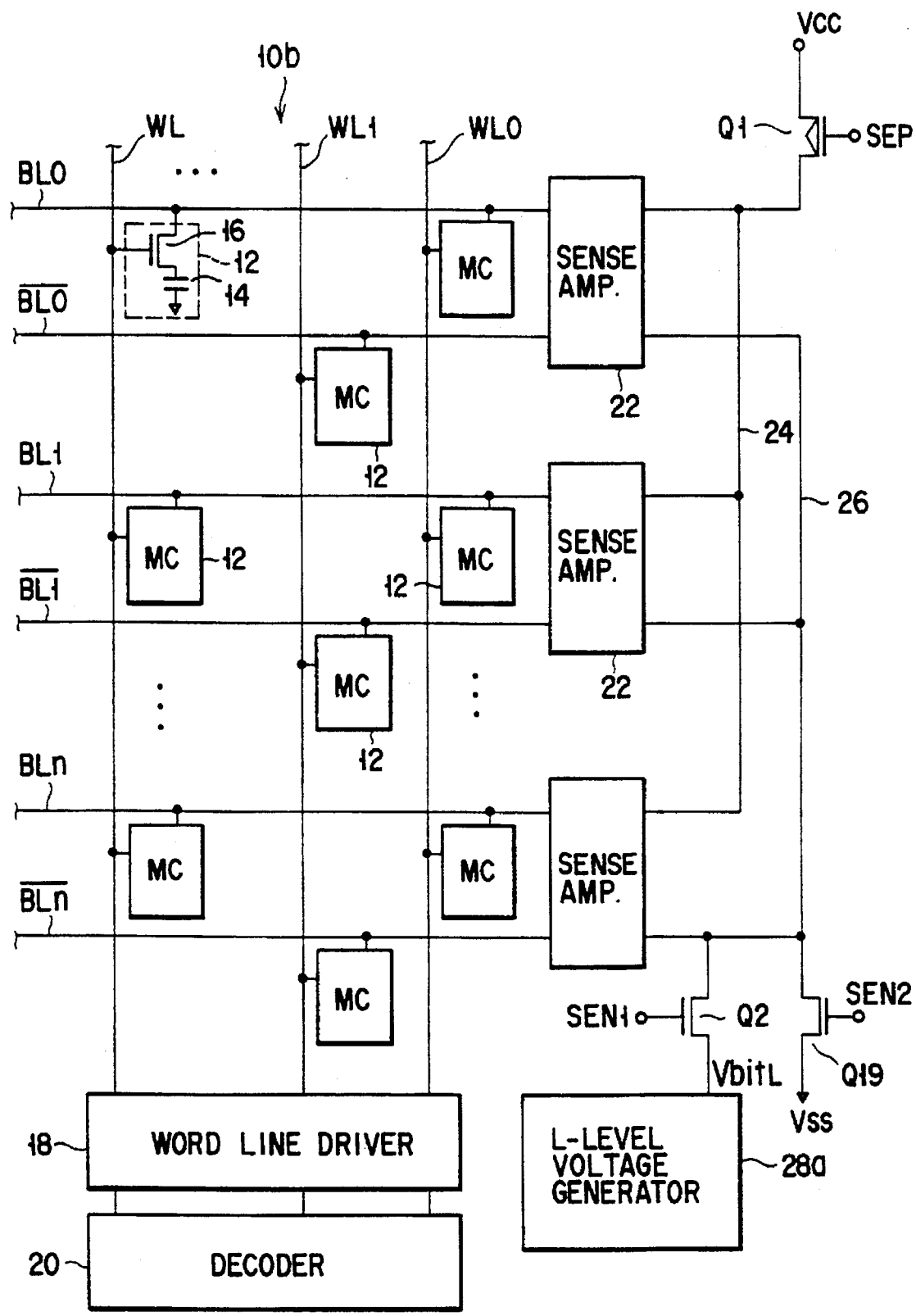
F I G. 14

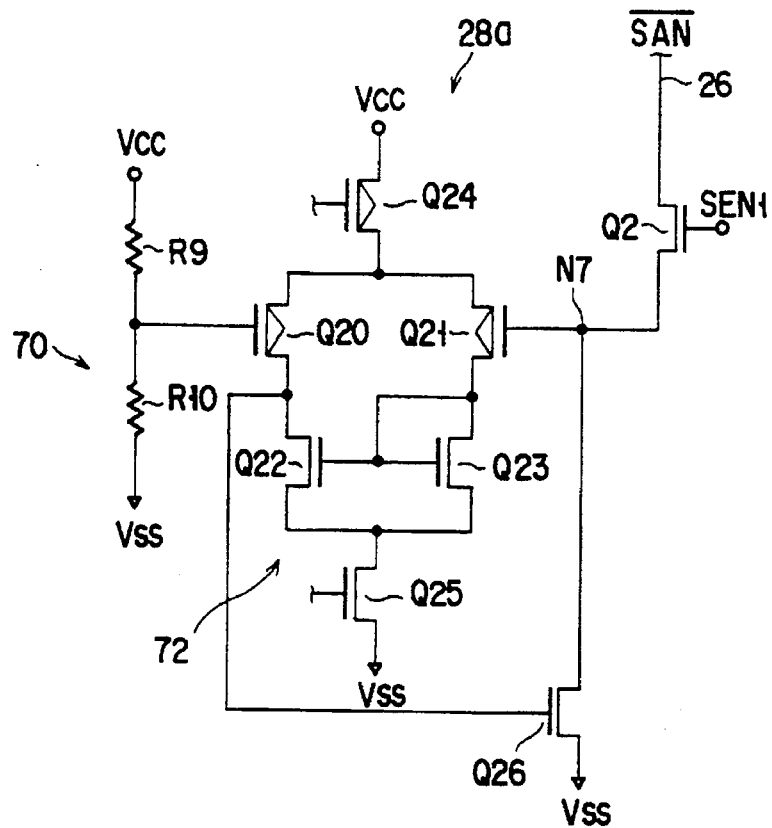
F I G. 15
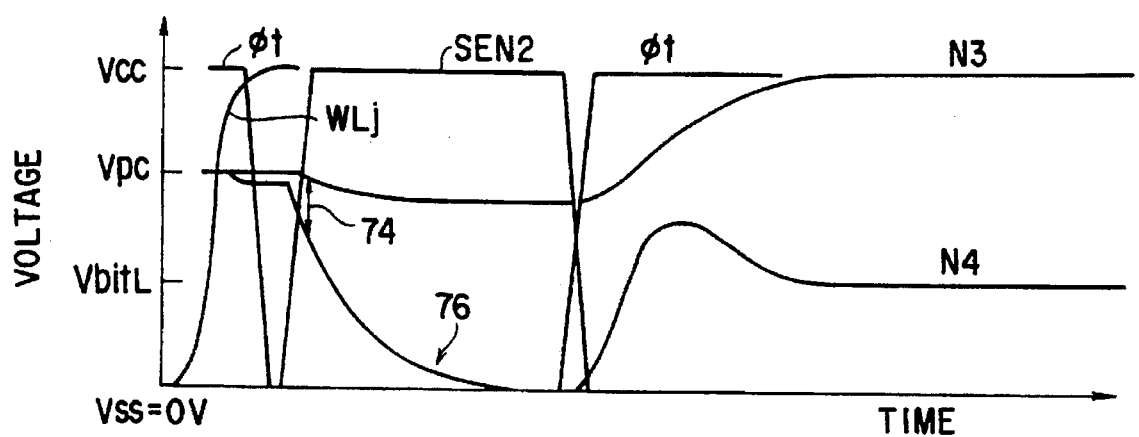
F I G. 16

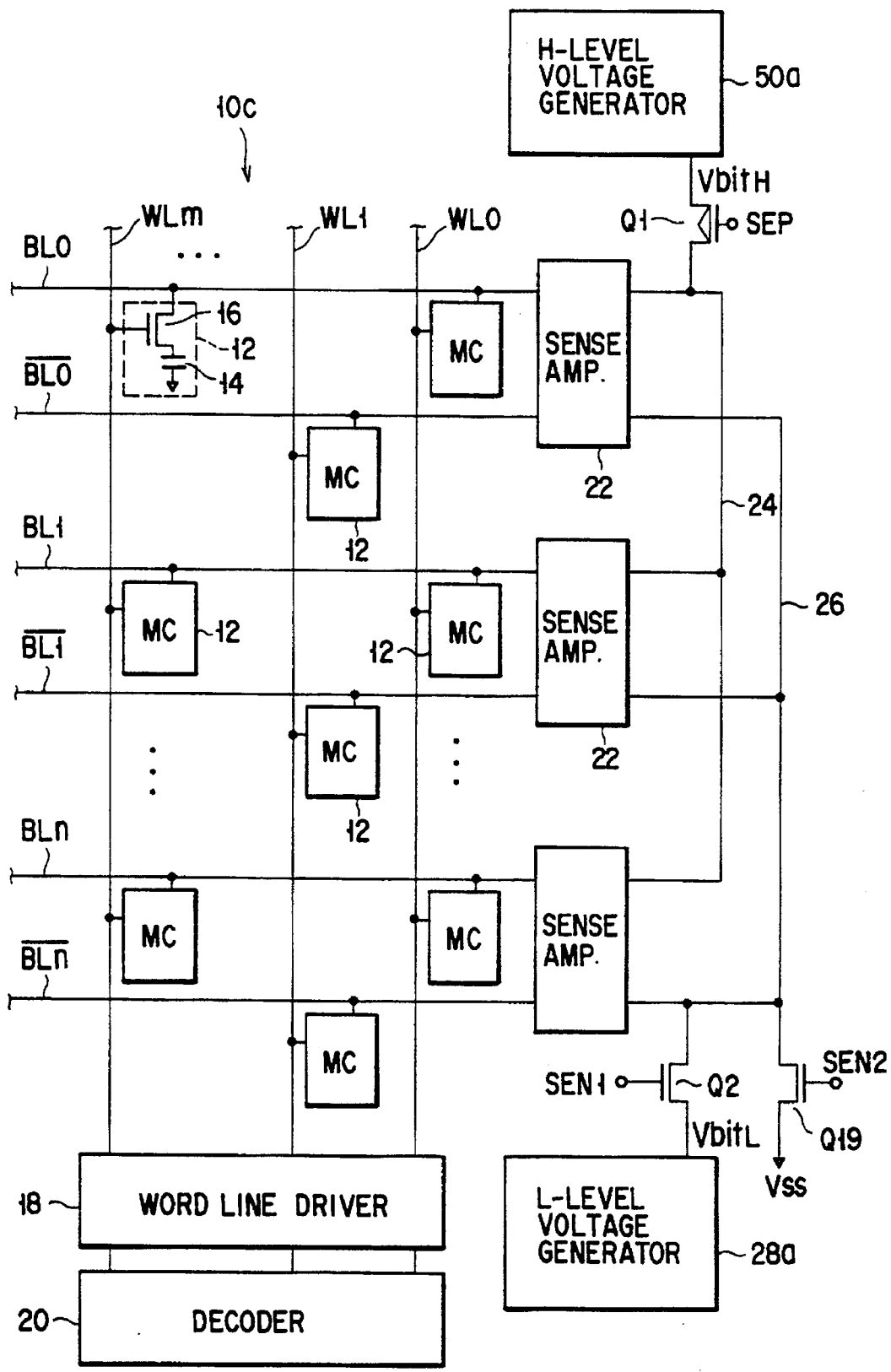
F I G. 17

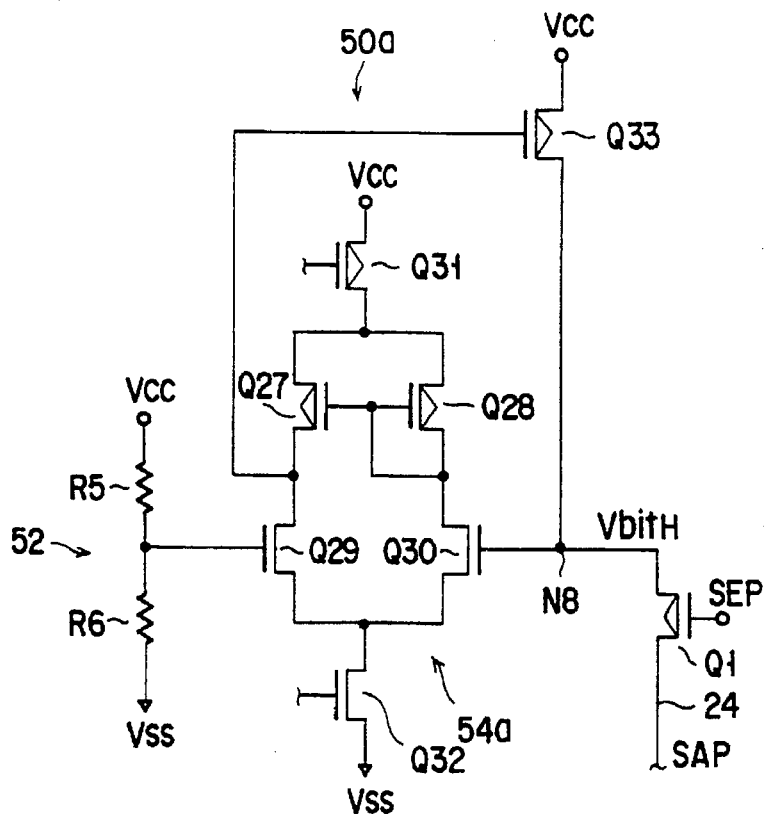
F I G. 18
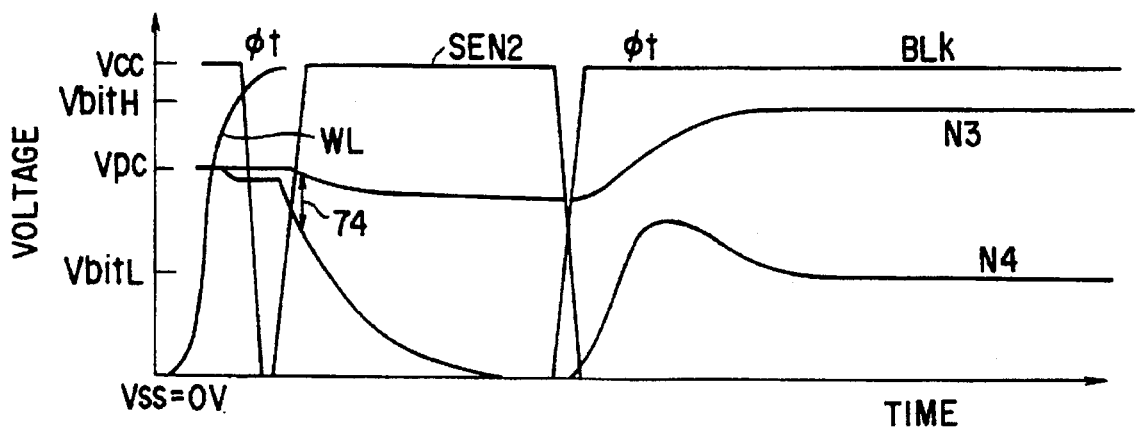
F I G. 19

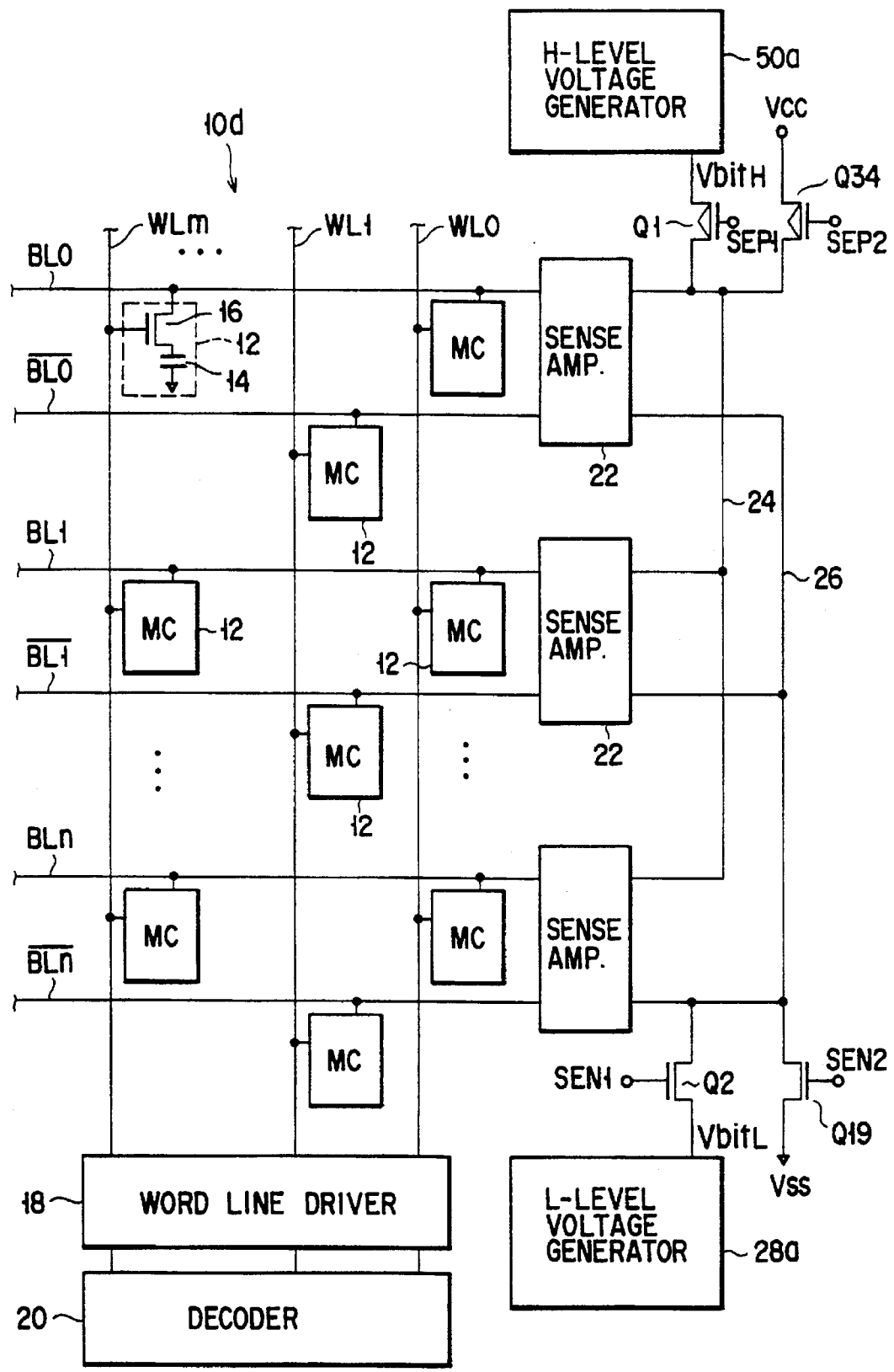
F I G. 20

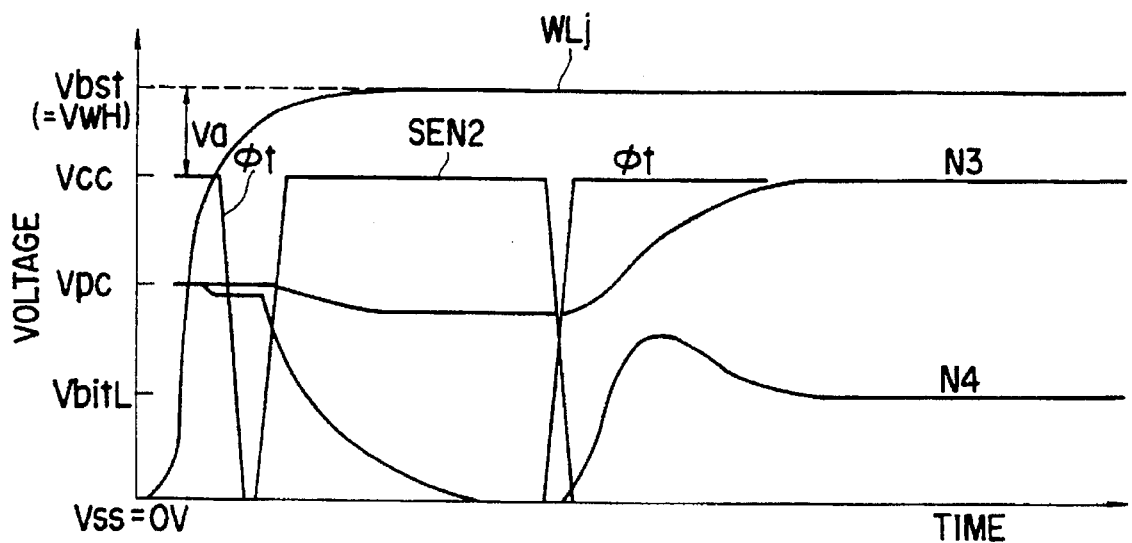
F I G. 24
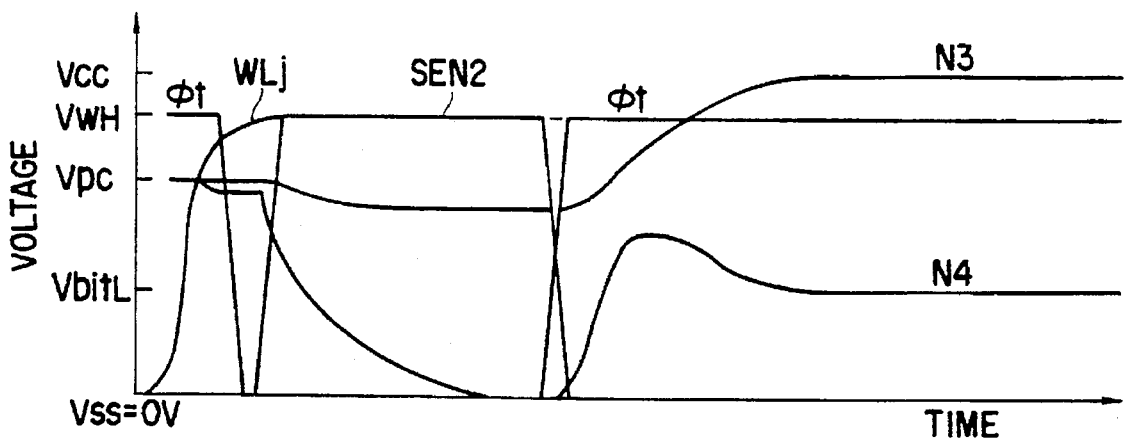
F I G. 25

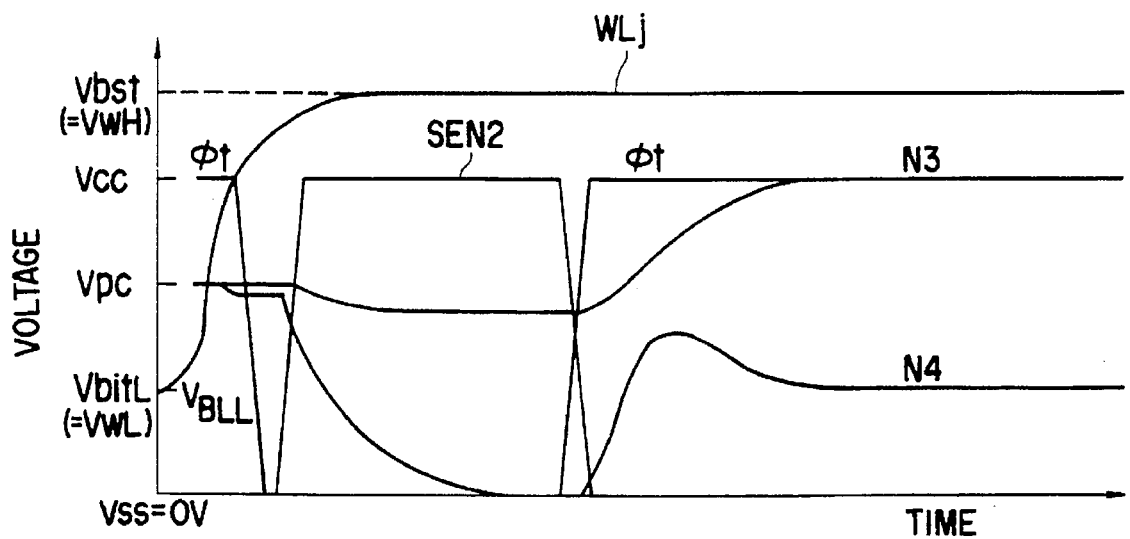
F I G. 26
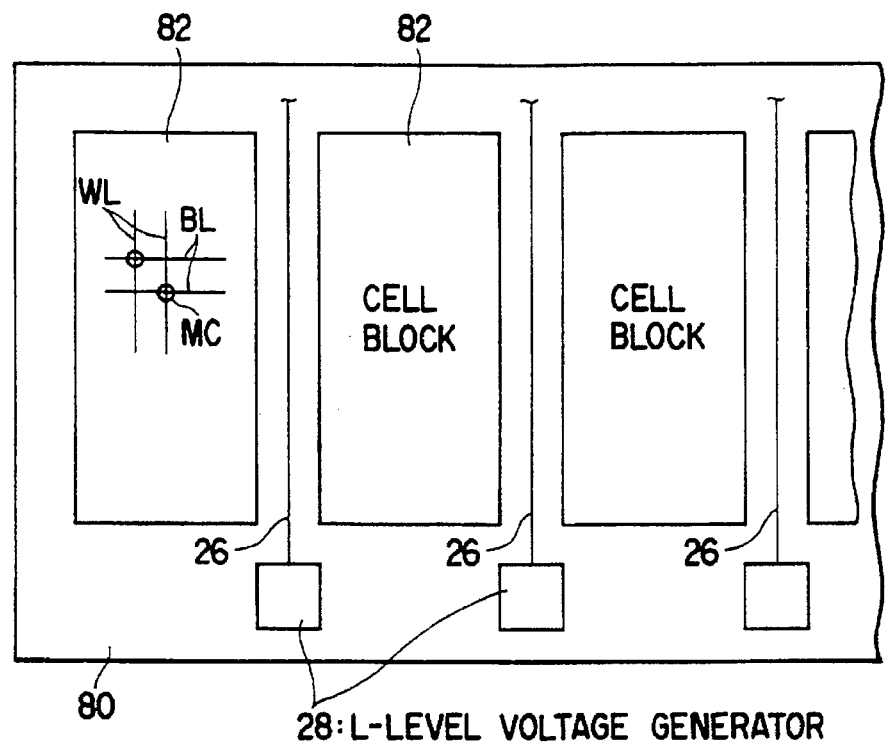
F I G. 27

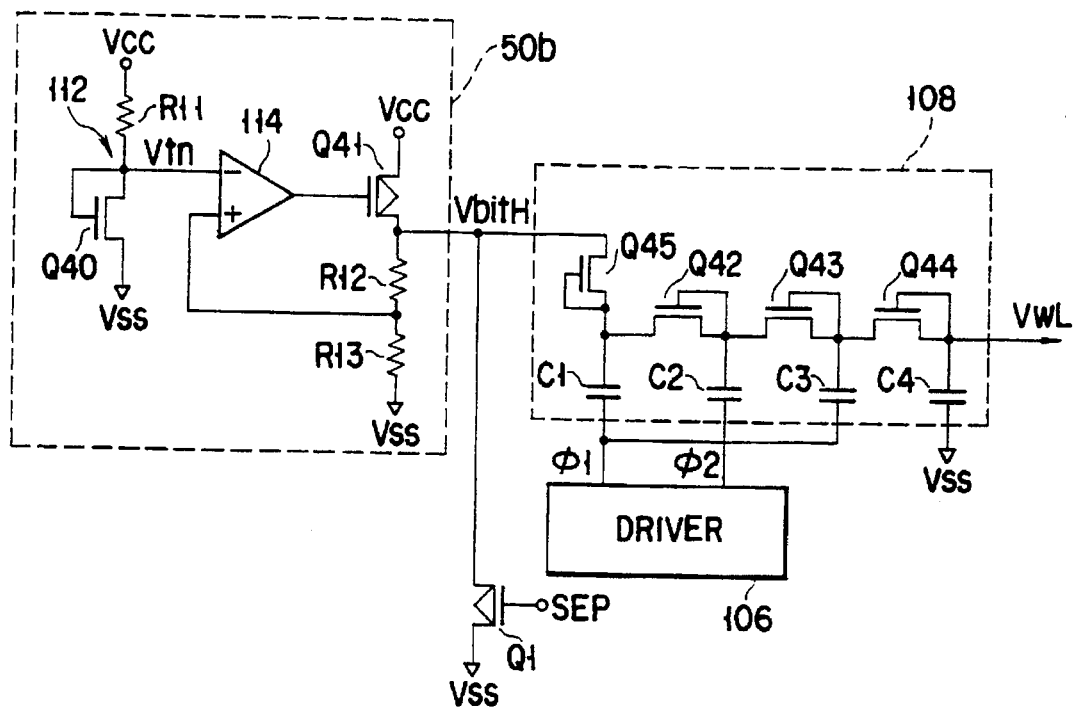
F I G. 33
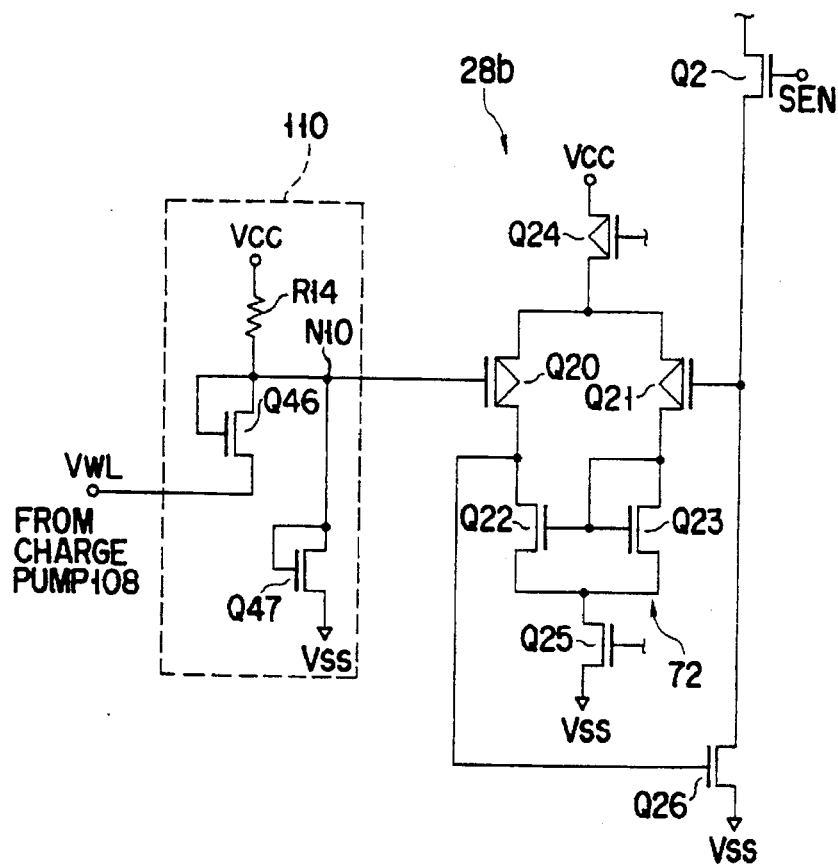
F I G. 34

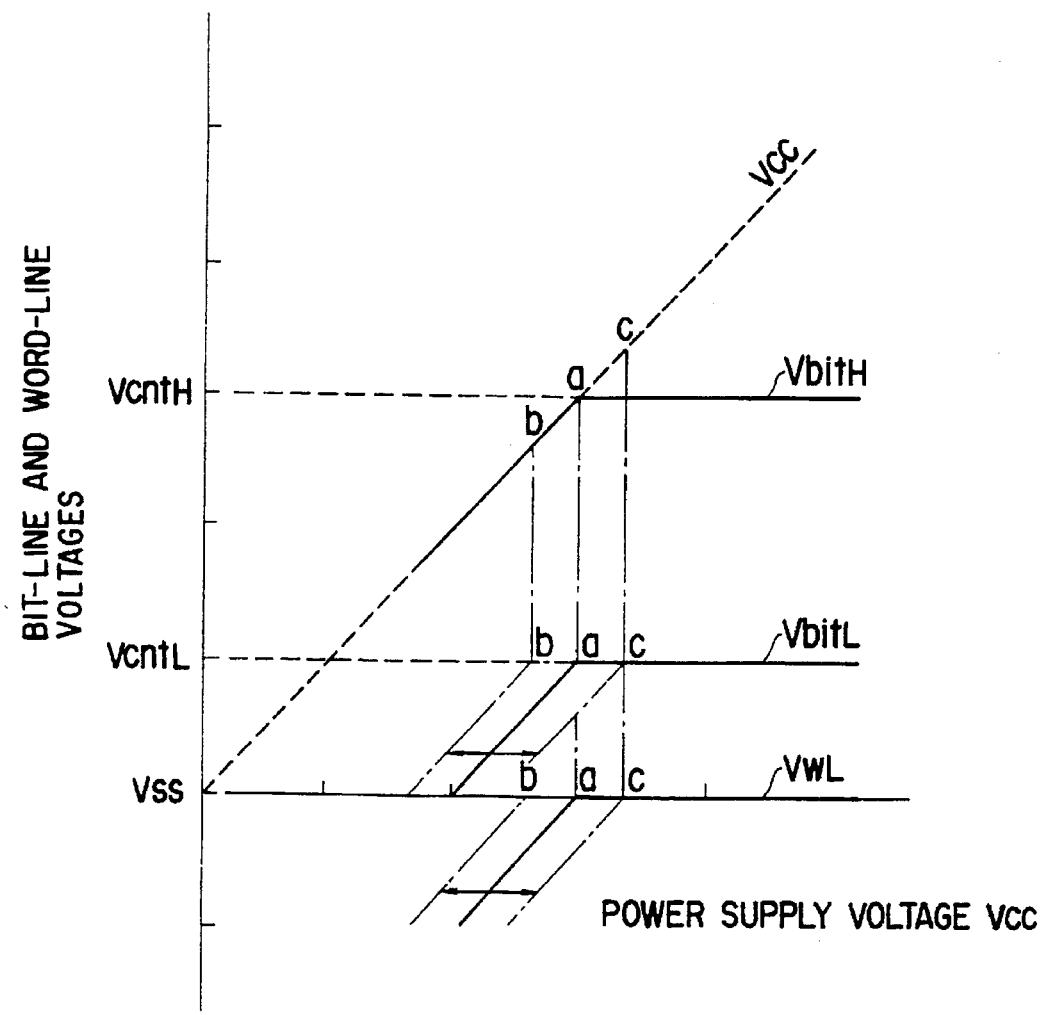
F I G. 36
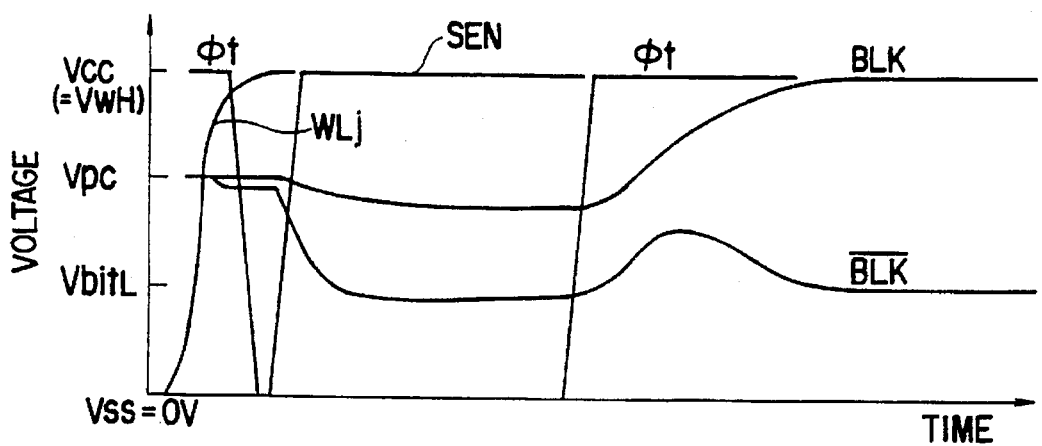
F I G. 37

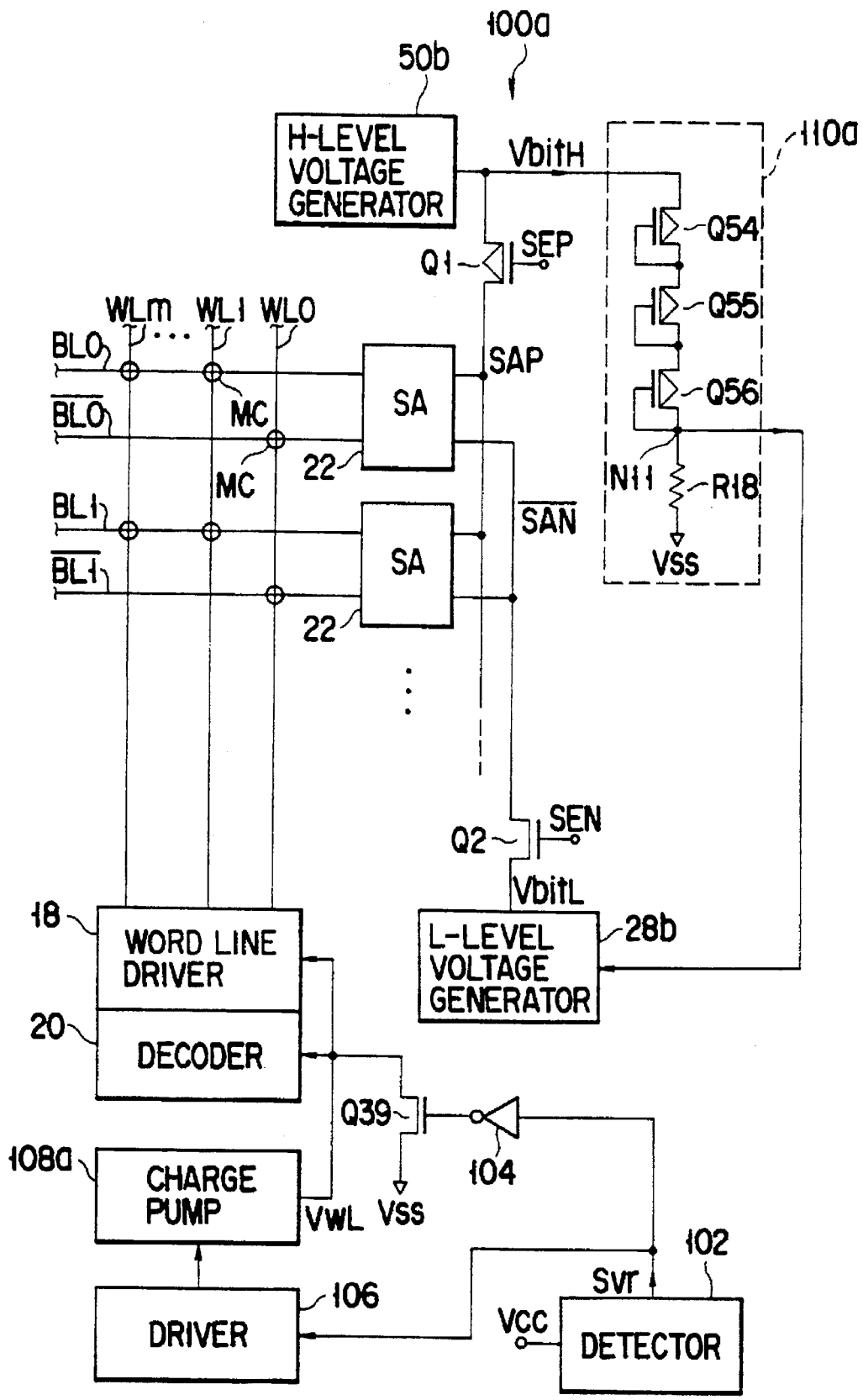
F I G. 38

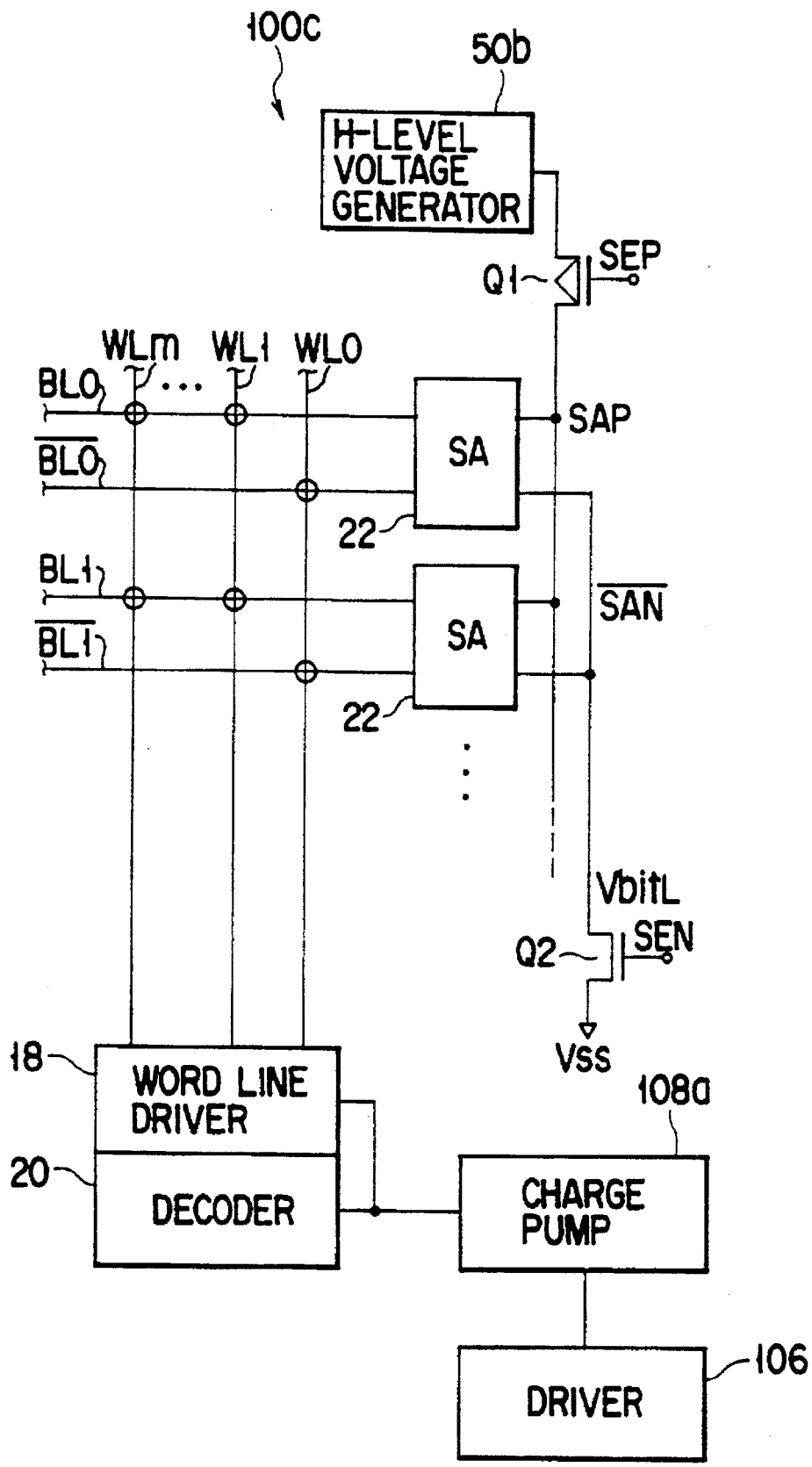
F I G. 44

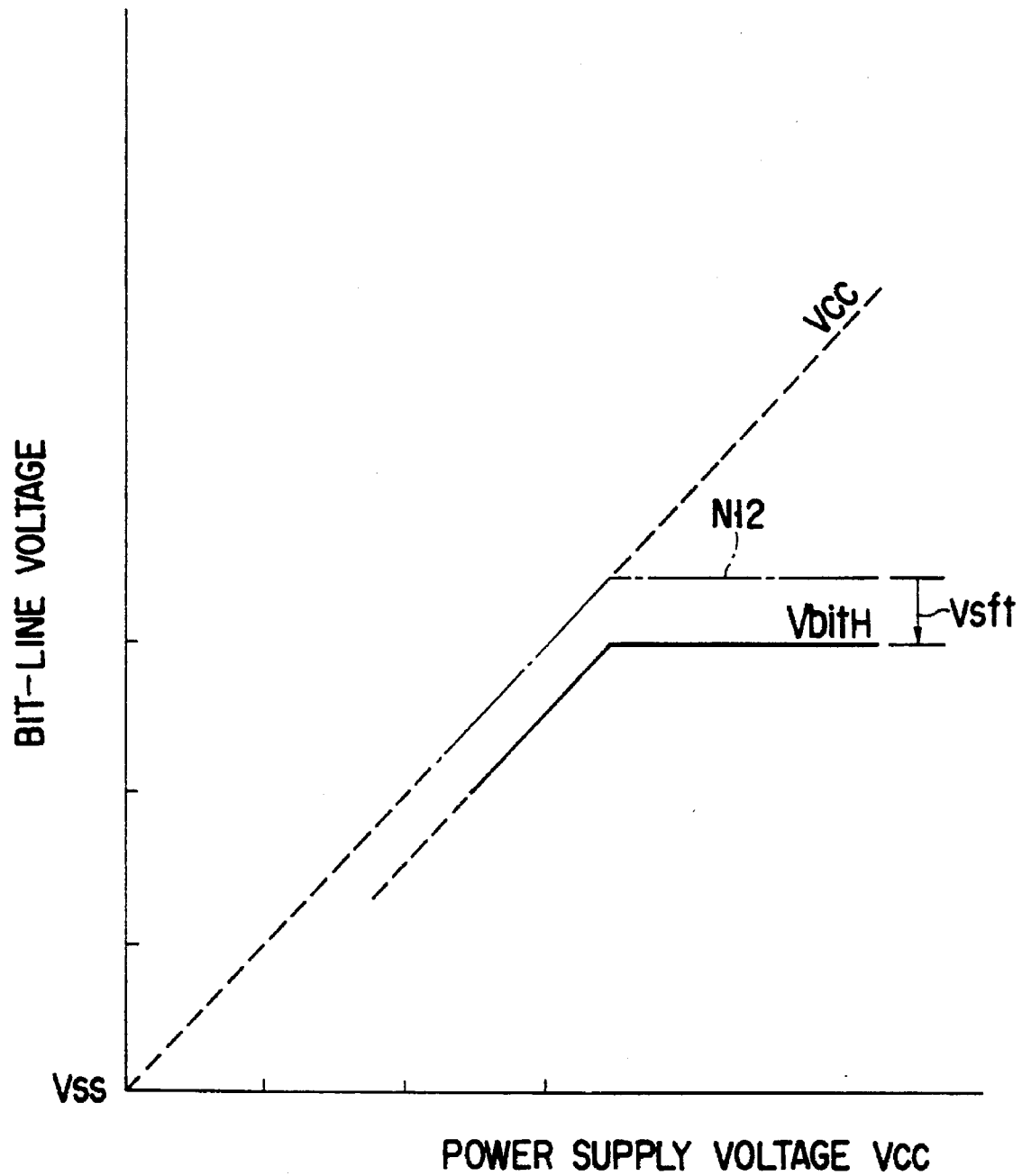
F I G. 47

MOS SEMICONDUCTOR DEVICE WITH MEMORY CELLS EACH HAVING STORAGE CAPACITOR AND TRANSFER TRANSISTOR

This is a Continuation of application Ser. No. 08/197,409 filed on Feb. 16, 1994, now U.S. Pat. No. 5,226,604, which is a Continuation of application Ser. No. 07/907,645, filed on Jul. 2, 1992 now U.S. Pat. No. 5,299,154.

BACKGROUND OF THE INVENTION

1. Field of the Invention

The present invention relates generally to semiconductor memory devices, and more particularly to a highly-integrated dynamic random access memory having an array of rows and columns of memory cells each of which includes a capacitive element and a data transfer transistor.

2. Description of the Related Art

With the increasing needs for high performance and high reliability of digital computer systems, dynamic random access memories (DRAMs) are becoming more important in the role thereof. Typically, DRAMs include an array of memory cells each of which includes a capacitor and a metal oxide semiconductor (MOS) field effect transistor, which is connected between a bit line and the capacitor and has a gate electrode coupled to a corresponding one of word lines. The capacitor acts as a data storage element. The MOS transistor serves as a transfer gate for transferring data to or from the storage capacitor.

As the number of bits increases in order to provide higher packing density, the cell size decreases, the microfabrication of the storage capacitor and the transfer MOS transistor in each cell becomes significant. The storage capacitor decreases in the magnitude of storage capability to reduce the amount of signal charge carriers that can be stored in the capacitor at a time. The MOS transistor becomes thinner in its gate insulation film. These factors result in that, in addition to reduction of the signal voltage in magnitude, the internal electric field at the gate insulation film goes high in each cell under application of the same word-line voltage, thereby causing a resultant time-dependent dioxide breakdown (TDDB) to be extreme undesirably, which leads to decrease in the reliability of the DRAMs.

SUMMARY OF THE INVENTION

It is therefore an object of the present invention to provide a new and improved semiconductor dynamic random access memory device.

It is another object of the invention to provide a new and improved semiconductor dynamic random access memory which can allow the signal amount of highly integrated cells to remain significant in magnitude and which can attain high reliability by minimizing the occurrence of TDDB damage.

In accordance with the above objects, the present invention is drawn to a random access memory device, including an array of memory cells each of which has a capacitive element and a data transfer transistor. Bit lines are connected to these cells. Word lines extend transverse to the bit lines, and connected to a decoder section. A sense amplifier section is connected to the bit lines, for sensing and amplifying a signal voltage read from a selected cell onto a bit line associated therewith. The signal voltage may change between a first and a second potential defining the high- and low-level voltages for the bit lines. A low-level voltage generator is connected to the sense amplifier section, for providing, as the bit-line low-level voltage, a specific voltage that is higher than the source voltage of the memory device to enhance a current cut-off capability of the transfer transistor. This may allow the transistor to decrease in threshold voltage.

The foregoing and other objects, features, and advantages of the invention will become apparent from the following more particular description of preferred embodiments of the invention, as illustrated in the accompanying drawings.

BRIEF DESCRIPTION OF THE DRAWINGS

FIG. 7 is a block diagram of a DRAM in accordance with another embodiment of the invention.

FIG. 8 is a circuit diagram of a bit-line H-level voltage generator included in the RAM of FIG. 7.

FIG. 9 is an illustration of the voltage changing sequences for the operation of the DRAM of FIG. 7, and FIG. 10 is a diagram showing an modification of the voltage waveforms shown in FIG. 9.

FIG. 11 is a graph showing the gate voltage to current characteristic of a transfer transistor employed in each cell of the present invention together with that of a prior art.

FIGS. 12 and 13 are graphs showing some characteristic curves of the word-line H-level voltage versus bit-line L-level voltage under different settings of the signal amount.

FIG. 14 is a block diagram of a DRAM in accordance with a still another embodiment of the invention.

FIG. 15 is a circuit diagram of a bit-line L-level voltage generator employed in the RAM of FIG. 14, and FIG. 16 is an illustration of the voltage changing sequences for the operation of the DRAM of FIG. 14.

FIG. 17 is a block diagram of a DRAM in accordance with a still another embodiment of the invention.

FIG. 18 is a circuit diagram of a bit line H-level voltage generator in the RAM of FIG. 17, and FIG. 19 is an illustration of the voltage changing sequences for the operation of the DRAM of FIG. 17.

FIG. 20 is a block diagram of a DRAM in accordance with a further embodiment of the invention.

FIGS. 24 to 26 are illustrations of some modified voltage changing sequences at the main components of the DRAMs.

FIGS. 27 to 29 are plan views of DRAMs showing some internal circuit layout examples thereof.

FIGS. 33 to 35 are circuit diagrams of the main components of the DRAM.

FIG. 36 is a characteristic graph of power supply voltage compensation performed in the DRAM of FIG. 32, and FIG. 37 is a diagram showing the voltage change sequences for the operation of this DRAM.

FIG. 38 is a block diagram of a DRAM in accordance with a still another embodiment of the invention.

FIGS. 42 and 44 are circuit diagrams of DRAMs in accordance with further embodiments of the invention.

FIG. 47 is a characteristic graph of the power supply voltage compensation of a DRAM employing the circuit shown in FIG. 46.

DETAILED DESCRIPTION OF THE PREFERRED EMBODIMENTS

Figure 1:
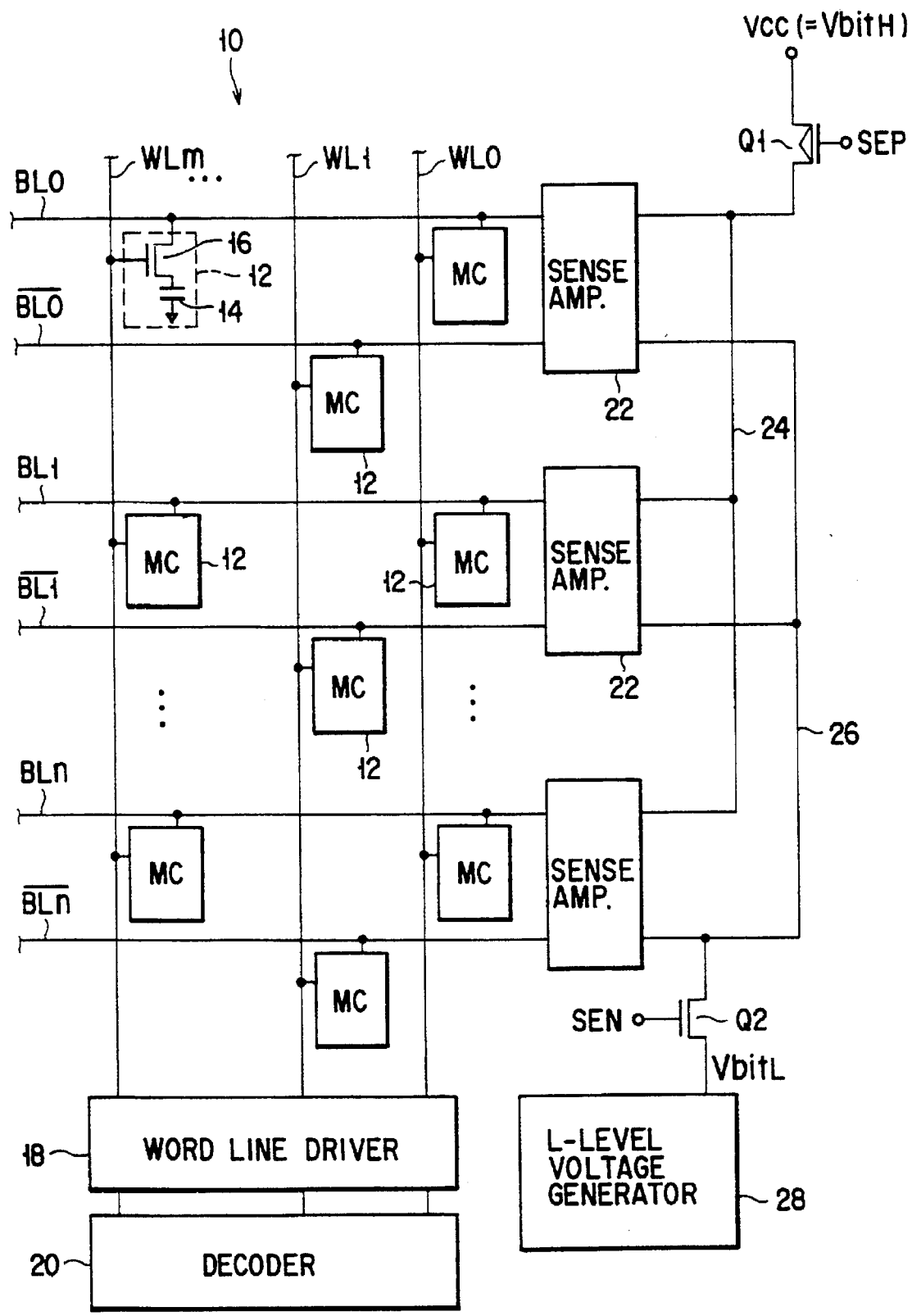
FIG. 1 is a block diagram of a semiconductor random access memory (DRAM) in accordance with one preferred embodiment of the invention.

Referring now to FIG. 1, a MOS random access memory (DRAM) in accordance with one preferred embodiment of the invention is generally designated by the numeral 10. The DRAM 10 includes a plurality of pairs of parallel bit lines BL0, $\overline{BL0}$, BL1, $\overline{BL1}$, ..., BLn, $\overline{BLn}$ extending in a first direction. Only for the typological convenience, "$\overline{BL}$" will be represented by "BL(bar)" hereinafter. Bit line BL(bar) in each bit-line pair is called the "dummy bit line". A preselected number of parallel word lines WL0, WL1, ..., WLm extend in a second direction transverse to bit line pairs BL, BL(bar) to define a number of crossing points therebetween. An array of memory cells 12 are arranged at selected ones of the crossing points between bit-line pairs BL, BL(bar) and word lines WL as shown in FIG. 1.

Each memory cell 12 includes a capacitor 14 and a MOS transistor 16 having current carrying electrodes (i.e., source and drain) connected to one electrode of capacitor 14 and to a corresponding bit line BLi (or BLi(bar), where i=0, 1, ..., k, ..., n) respectively. The other electrode of capacitor 14 is coupled constantly to a known plate voltage of preselected potential level. Transistor 16 has a gate electrode connected to a corresponding word line WLj (j=0, 1, ..., m). Capacitor 14 stores charge carriers that represent a data signal having a full logic level corresponding to the difference between a logic "1" and a "0". Transistor 16 turns on selectively in response to a voltage potential on word line Wlj, causing the data signal existing on bit line BLi to be transferred to capacitor 14. Capacitor 14 will be called "storage capacitor", and transistor 16 is called either "data transfer transistor" or "transfer-gate transistor". Note that, in this embodiment, the channel impurity concentration of transfer-gate transistor 16 is specifically arranged so that it is zero or negative in polarity.

As shown in FIG. 1, the word lines WL are connected to a word line driver circuit 18, which is responsive to a decoder 20. This decoder supplies driver 18 with an electrical signal that specifies a certain one from word lines WL. In responding to this signal, driver 18 applies the specified word line WLj with a predetermined high-level voltage VwH, while the remaining word lines are at a low-level voltage VwL.

A plurality of sense amplifier circuits 22 are connected to the bit-line pairs BL, BL(bar), respectively. Each of these sense amplifier circuits senses and amplifies a signal voltage that is read from a selected one of those memory cells 12 coupled to a corresponding bit-line pair BLi, BLi(bar) associated therewith. Sense amplifiers 22 are connected at their first outputs to a common source line 24, and connected at the second outputs thereof to another common source line 26, to which a control signal $\overline{SAN}$ is supplied. Line 24 is coupled, through the source and drain of a P-channel metal oxide semiconductor (MOS) field effect transistor Q1, to a terminal whereat the power supply voltage Vcc is supplied externally to DRAM 10. MOS transistor Q1 has a gate electrode to which a control signal SEP is supplied, and serves as an activation transistor. Line 26 is connected to the output of a voltage generating circuit 28 by way of the source and drain of an N-channel MOS (NMOS) transistor Q2. MOS transistor Q2 has a gate electrode being supplied with a control signal SEN, and acts as an activation transistor. Voltage generator 28 generates at its output a direct current (DC) voltage having a preselected potential to define a low-level voltage for bit-line pairs BL, BL(bar). This voltage will be called "bit-line low-level voltage VbitL" hereinafter. When MOS transistor Q2 turns on in response to signal SEN, the bit-line low-level voltage VbitL is applied to common source line 26.

Figure 2:
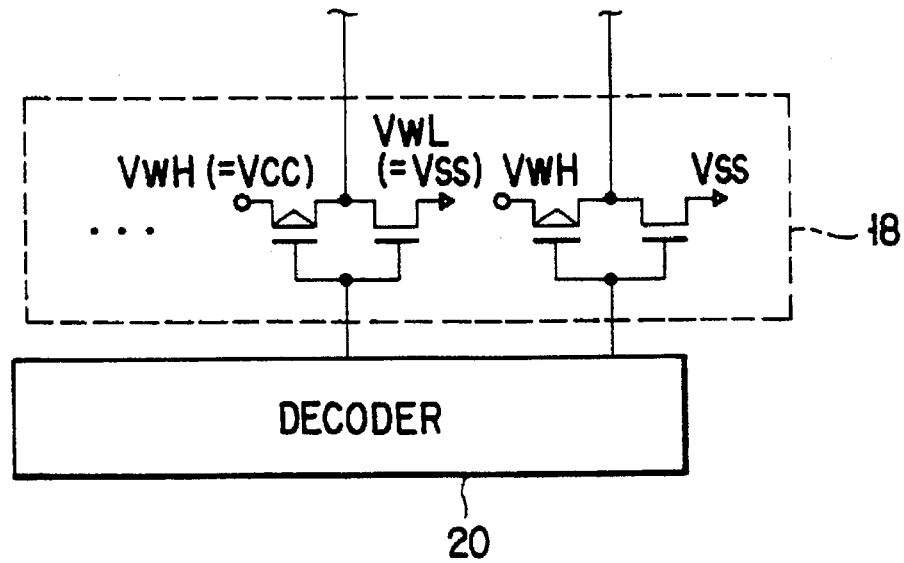
FIGS. 2, 3 and 4 are circuit diagrams showing the internal configuration of the main circuits of the DRAM shown in FIG. 1.

The internal circuit configuration of the word line driver 18 is shown in FIG. 2, wherein driver 18 includes a plurality of pairs of complementary MOS (CMOS) inverter circuits, which are connected to the word lines WL at their common source-and-drain connection nodes. Each CMOS inverter essentially consists of a pair of MOS transistors of different channel conductivity types, i.e., a P-channel MOS (PMOS) transistor and an N-channel NMOS (NMOS) transistor. The gate electrodes of these transistors are connected in common to a corresponding output of decoder 20. One of the transistor pair is coupled to the power supply voltage Vcc, and the other of it is coupled to the source voltage Vss (ground potential). Driver 18 may selectively provide power supply voltage Vcc as a word-line high-level voltage VwH, and source voltage Vss as a word-line low-level voltage VwL.

Figure 3:
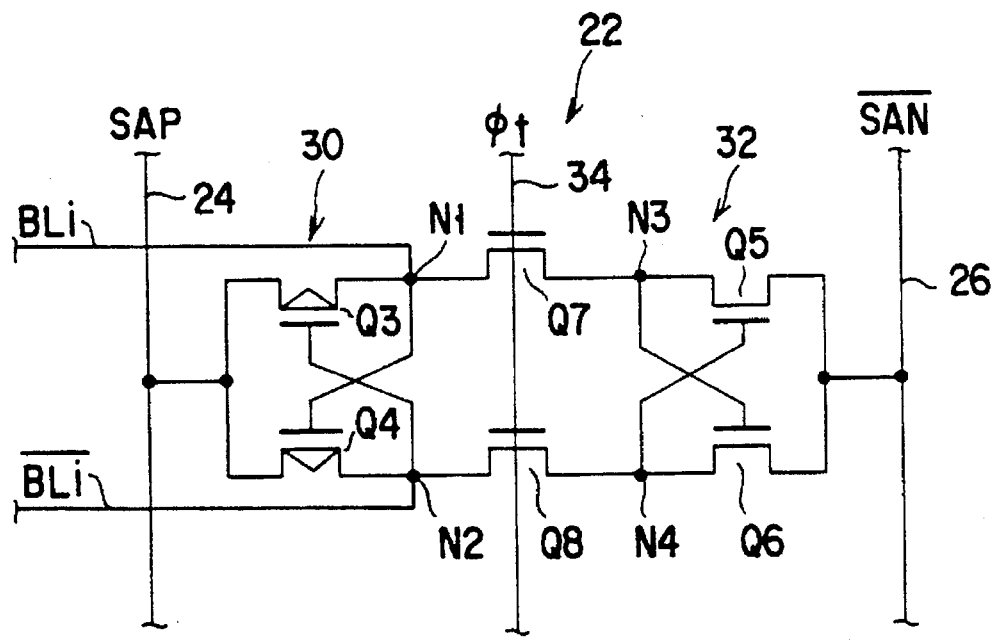

As shown in FIG. 3, each of the sense amplifiers of FIG. 1 includes a PMOS sense amplifier circuit 30 and an NMOS sense amplifier circuit 32. PMOS sense amplifier circuit 30 includes PMOS transistors Q3 and Q4 that are cross-coupled to each other at the gate electrodes and the first current carrying electrodes (drain electrodes in this case). The second current carrying electrodes (source electrodes) of MOS transistors Q3, Q4 are connected to the common source line 24. MOS transistors Q3, Q4 are connected at cross-coupling nodes N1, N2 to a corresponding pair of bit lines BLi, BLi(bar).

The NMOS sense amplifier 32, on the other hand, includes NMOS transistors Q5, Q6 that are cross-coupled to each other at their gate electrodes and first current carrying electrodes. The second current carrying electrodes of MOS transistors Q5, Q6 are connected to the other common source line 26 as shown in FIG. 3. MOS transistors Q5, Q6 are connected at their cross-coupling nodes N3, N4 to a bit-line pair BLi', BLi(bar)' (not shown), which is accompanied with the bit-line pair BLi, BLi(bar). An NMOS transistor Q7 is connected between nodes N1, N3 of PMOS and NMOS sense amplifiers 30, 32. Another NMOS transistor Q8 is connected between nodes N2, N4. Transistors Q7, Q8 have gate electrodes coupled to a control clock signal φt line 34, and function as transfer gates.

Figure 4:
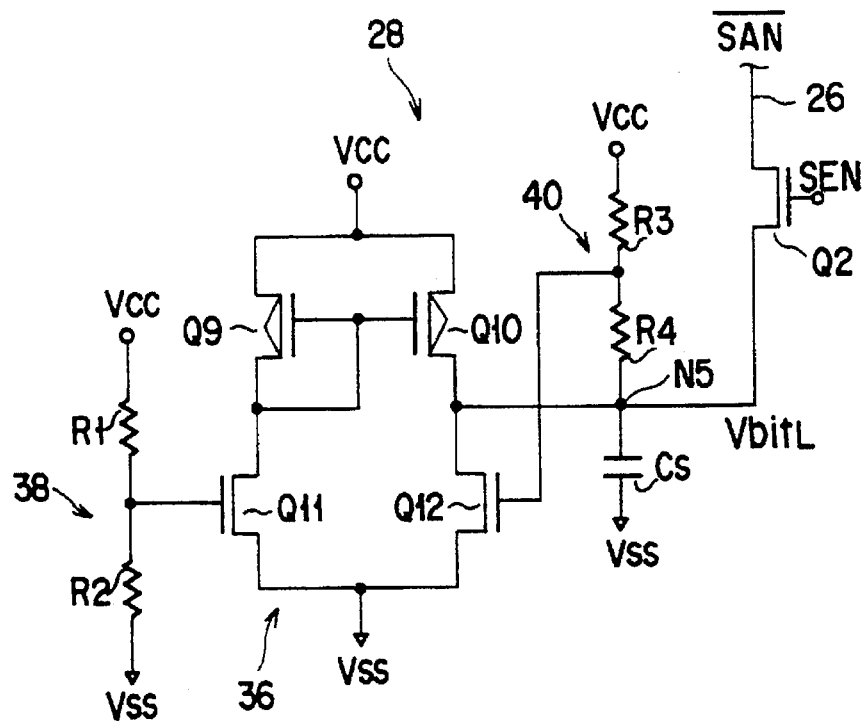

As shown in FIG. 4, the L-level voltage generator 28 of FIG. 1 includes PMOS transistors Q9, Q10 connected together at their gate electrodes and a current-mirror type CMOS differential amplifier circuit 36 having NMOS transistors Q11, Q12 connected in series to the PMOS transistors Q9, Q10 respectively. The circuit of transistors Q9–Q12 is connected between the power supply voltage Vcc and the source voltage (ground potential) Vss. The gate electrode of MOS transistor Q11 is coupled to the intermediate connection node of resistors R1, R2 that are series-connected between voltages Vcc, Vss. Resistors R1, R2 constitute a voltage-dividing circuit 38 for reference voltage generation. The common source-and-drain connection node of transistors Q10, Q12 is connected through resistors R3, R4 to power supply voltage Vcc, and connected through a capacitor Cs to source voltage Vss. A circuit node N5 between resistor R4 and capacitor Cs is the output of the voltage generator 28, and is connected to the common source line 26 by way of activation transistor Q2. Resistors R3, R4 function as a feedback circuit 40 for CMOS differential amplifier 36.

The L-level voltage generator 28 compares the output voltage of the reference voltage generator 38, which is at a predetermined intermediate DC potential between the power supply voltage Vcc and the source voltage Vss, with the potential at the output node N5, thereby generating at node N5 the bit-line low-level voltage VbitL, which is potentially greater by a preselected potential than source voltage Vss. When the transistor Q2 turns on, voltage VbitL is applied to one bit line on the low-level side of a selected pair of bit lines BLk, BLk(bar) associated with an activated sense amplifier. In this embodiment, it is set at 0.7 volts, for example.

Figure 5:
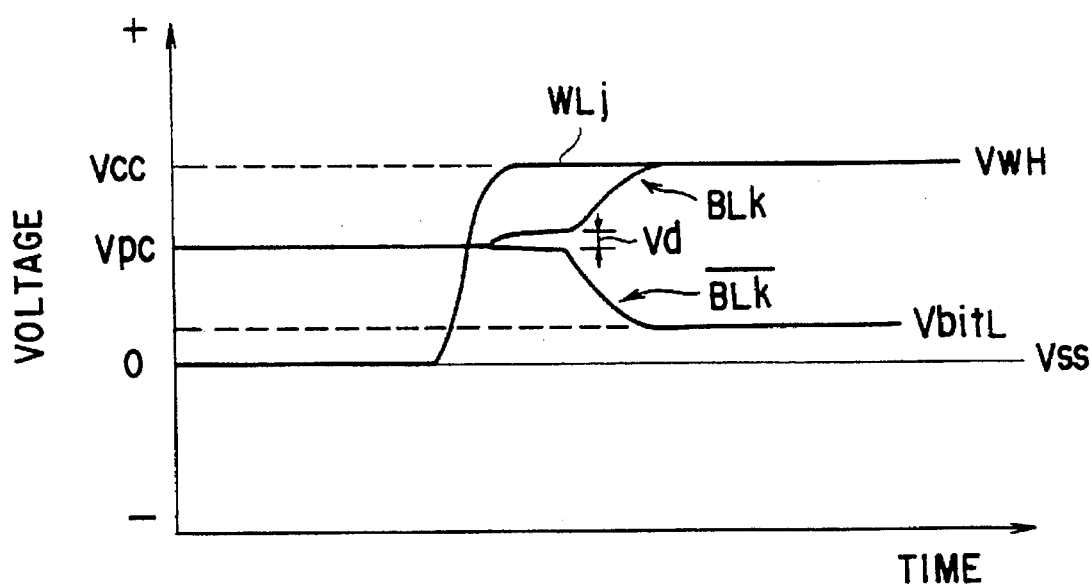
FIG. 5 is an illustration of the voltage changing sequences on a pair of bit lines coupled to a selected memory cell and a corresponding word line of the DRAM of FIG. 1.

The operation of the DRAM 10 is as follows. In a read mode, when the decoder 20 of FIG. 1 selects one from among the word lines WL0, WL1, ..., WLm, the selected word line WLj (j=0, 1, ..., or m) is applied by word line driver 18 with the word-line high-level voltage VwH. As indicated previously, since voltage VwH is equal in potential to the power supply voltage Vcc in this case, the potential on the selected word line WLj rises toward voltage Vcc as shown in FIG. 5. The remaining non-selected word lines WL0, ..., WL(j-1), WL(j+1), ..., WLm are kept at the source voltage Vss. In FIG. 5, "Vpc" is used to represent a precharge voltage, which is between the bit-line low-level voltage VbitL and bit-line high-level voltage VbitH (typically, it is VbitH/2).

By the application of the word-line high-level voltage VwH, transfer-gate transistors 16 of those memory cells which are connected to the selected word line WLj turn on. The signal charge carriers accumulated in the storage capacitors 14 of the cells are then read out onto the bit lines BL0, BL1, ..., BLn (or BL0(bar), BL1(bar), ..., BLn(bar)) by way of the transfer transistors. Looking at one bit-line pair BLk, BLk(bar) for the convenience of explanation, a corresponding dummy word line (not shown in FIG. 1) is also selected so that the charge carriers stored in a dummy cell coupled thereto appears on the dummy bit line BLk(bar) (or bit line BLk) in a similar manner.

Assume that the read data is a logic "1" (high-level voltage equal to the power supply voltage Vcc). The bit line BLk rises slightly in potential by reading signal charge carriers out of the selected memory cell. During this period, the potential on dummy bit line BLk(bar) is kept unchanged.

As a result, a small potential difference Vd arises between bit lines BLk, BLk(bar) as shown in FIG. 5. Thereafter, the activation transistors Q1, Q2 for sense amplifiers 22 turn on in response to the control signals SEN, SEP. The first common source line 24 is thus applied with the power supply voltage Vcc, and the second common source line 26 is at the bit-line low-level voltage VbitL (>Vss). A sense amplifier connected to the selected bit-line pair BLk, BLk(bar) is activated together with the remaining sense amplifiers 22. In the activated sense amplifier, the PMOS transistor Q3 of FIG. 3 turns on, causing power supply voltage Vcc to be applied to bit line BLk. Simultaneously, NMOS transistor Q6 turns on. Low-level voltage VbitL is then applied to dummy bit line BLk(bar) through transistor Q6 and transfer gate transistor Q5.

The small potential difference Vd between the bit lines BLk, BLk(bar) is amplified in magnitude by the activated sense amplifier 22 in such a manner that bit line BLk rises potentially toward the bit-line high-level voltage VbitH (=Vcc) and is then latched at this voltage, and that the potential at dummy bit line BLk(bar) decreases toward the bit-line low-level voltage VbitL and is latched at voltage VbitL as shown in FIG. 5. Since voltage VbitL is higher than the source voltage Vss, the latch potential of dummy bit line BLk(bar) is prevented from dropping down to source voltage Vss.

Subsequently, the logic "1" data (high-level data voltage) on the selected bit line BLk is rewritten through transfer-gate transistor 16 into the storage capacitor 14 of the same memory cell 12 from which the data was read. As has been already explained, since the threshold voltage Vth of transistor 16 is as low as zero volts or a negative polarity value, the high-level voltage Vcc can be transferred to and written into capacitor 14 at improved efficiency, without having any potential loss due to what is called the "threshold voltage drop" phenomenon. In the case where the read data on the bit line BLk is a logic "0", the operation is substantially same as the above case except the fact that the latched voltage of this bit line is the bit-line low-level voltage VbitL.

The significant features of DRAM 10 are as follows. The low-level voltage VbitL of each bit line BLi is set at a specific positive voltage that is higher than the common source voltage Vss (=0 volts) as previously described. In other words, the current carrying electrode of the transfer transistor 16 which is connected to bit line BLi in each memory cell 12 is prevented from dropping down to source voltage Vss throughout the access and non-access periods (select and non-select modes of memory cells). This can improve the current cut-off characteristic of transistor 16, which will lead to enhancement of the signal-charge storing capability of each cell and also to extension of data storageable time period. As a consequence, it is possible to improve the sub-threshold characteristic of transfer transistor 16. It can thus be suppressed or eliminated that a leak current flow occurs during the signal charge storage period.

Such improvement of the sub-threshold characteristic may allow the threshold voltage Vth of transfer-gate MOS transistor 16 to decrease. Note here that the threshold voltage Vth may be defined as the minimum voltage required to cause an inversion layer to be formed in the channel region by a MOS capacitor constituted by an insulated gate electrode, thereby forcing this transistor to turn on. The decrease or reduction of threshold voltage Vth may be attained by changing the impurity concentration in the substrate surface region of transistor 16. Actually, with the present embodiment, the threshold voltage Vth of transfer transistor 16 is decreased to zero or a negative polarity value, as previously described. The decrease in threshold voltage Vth causes the signal amount transferred to or from storage capacitor 14 through transistor 16 to increase under application of the same voltage (i.e., the word-line high-level voltage VwH) to the gate electrode of transistor 16. More specifically, the gate voltage of transfer transistor 16, i.e., the word-line high-level voltage VwH, can no longer be required to be higher than the power supply voltage Vcc in order to increase the signal amount. With DRAM 10, the above features enable, by increasing the bit-line low-level voltage VbitL to be higher than source voltage Vss, the internal electric field created in the gate insulation film of micro-fabricated transfer transistor 16 to become weaker in addition to an increase in the signal amount of each cell 12. This results in that the TDDB characteristic of DRAM 10 can be improved while attaining the enhanced operating reliability thereof.

Figure 6:
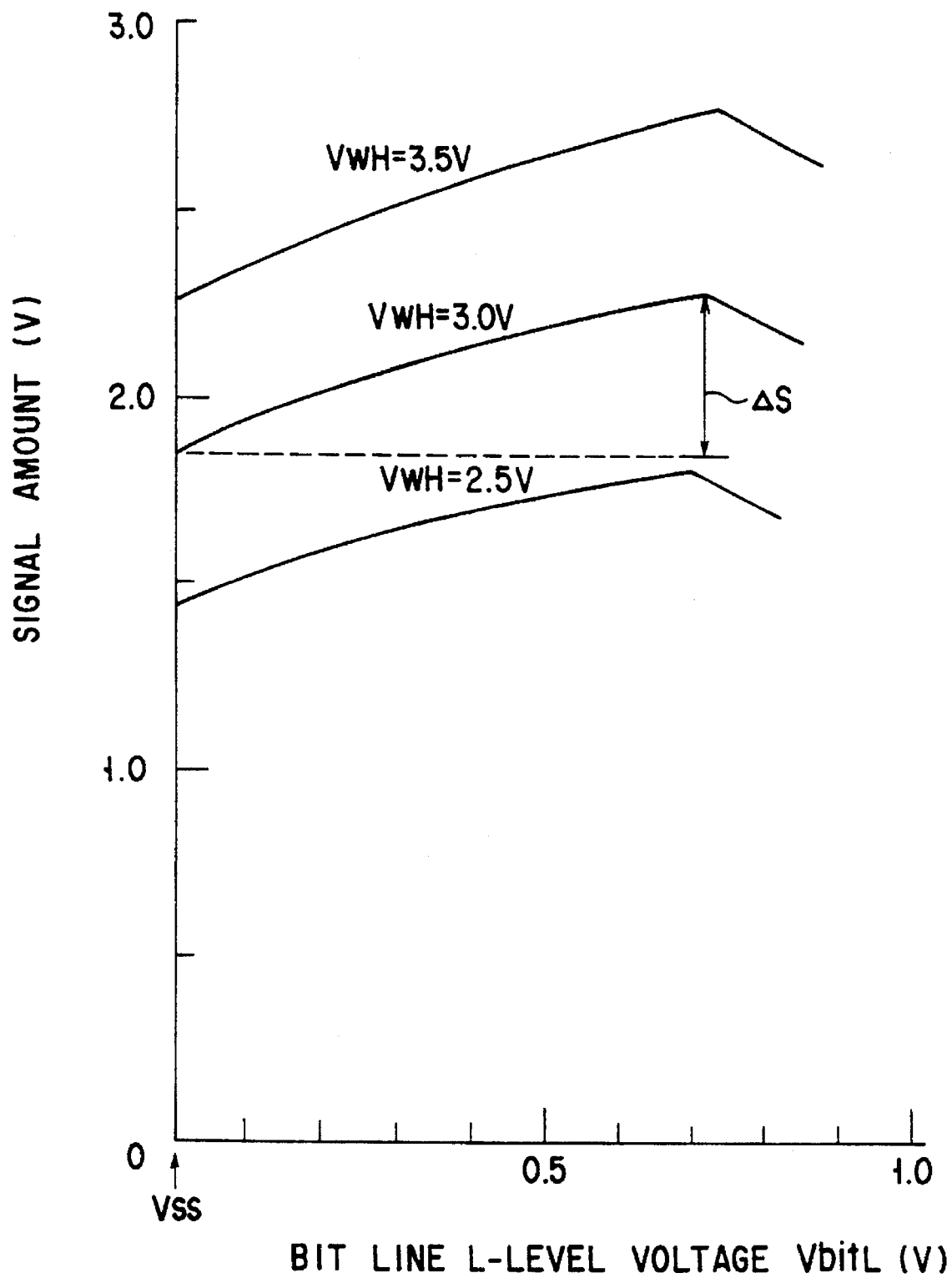
FIG. 6 is a storage characteristic graph of the DRAM wherein the signal amount of each cell increases as the L-level voltage for a bit line rises potentially from the source voltage.

The characteristic diagram of FIG. 6 demonstrates the fact that the signal amount of each cell increases in the embodiment. As is apparent from the graph of FIG. 6, in a case wherein the word-line high-level voltage VwH is selected at 3.0 volts, the signal amount can be increased up to 2.3 volts when the bit-line low-level voltage VbitL is increased from the source voltage Vss (=0 volts) to 0.7 volts. On the other hand, in the prior art under the same conditions (such as scaling of transistors, thickness of gate insulation film, etc.), since the bit-line low-level voltage VbitL is simply set at source voltage Vss, the signal amount remains as low as about 1.8 volts. The increase in the signal amount of the embodiment is designated by "ΔS" in FIG. 6. Such increase in signal amount will be maximum when the bit-line low-level voltage VbitL is selected at 0.7 volts. Obviously, the signal amount will be further increased as word-line high-level voltage VwH increases. Note here that, in this embodiment, when bit-line low-level voltage VbitL goes beyond 0.7 volts, it begins to decrease irrespective of the potential selection of word-line high-level voltage VwH. This is because a data voltage that can be written into the memory cell is constant in this case as is prevented from rising beyond the bit-line high-level voltage VbitH (=Vcc).

A DRAM 10a shown in FIG. 7 is similar to the DRAM 10 Of FIG. 1 with a bit-line high-level voltage (VbitH) generating circuit 50 being provided and connected to the source electrode of the activation transistor Q1 for the sense amplifiers 22. The VbitH voltage generator 50 provides a specific voltage that is potentially less than the power supply voltage Vcc as the bit-line high-level voltage VbitH to be applied to the selected bit line BLk.

As shown in FIG. 8, the bit line H-level generator 50 includes a reference voltage generating circuit 52, a current-mirror type CMOS differential amplifier circuit 54 and a feedback circuit 56. Reference voltage generator 52 may be a voltage-divider circuit consisting of a series circuit of resistors R5, R6. CMOS differential amplifier circuit 54 includes a pair of PMOS transistors Q14, Q15, and a pair of NMOS transistors Q17, Q18 serving as active loads. The circuits of transistors Q14–Q18 are arranged between the power supply voltage Vcc and the source voltage Vss. The common connection node of transistors Q14, Q15 is coupled to power supply voltage Vcc. The gate electrode of transistor Q14 is coupled to the intermediate node of resistors R5, R6. Feedback circuit 56 consists of a series circuit of resistors R7, R8. Resistor R7 has one end connected to a circuit node N6 acting as the output terminal of bit-line H-level generator 50, and the other end connected to the gate electrode of transistor Q15 together with one end of resistor R8. The other end of resistor R8 is coupled to voltage Vss. Feedback circuit 56 causes the voltage at output node N6 to be fed back to the gate electrode of transistor Q15. The bit-line high-level voltage VbitH developed at node N6 will be supplied by the common source line 24 to sense amplifiers 22 when activation transistor Q1 turns on.

The potential variation on the selected BLk, BLk(bar) of the DRAM 10a shown in FIG. 9 is similar to that of FIG. 5 except the fact that, when a selected word line WLj rises to the high-level voltage VwH (=Vcc), the selected bit line BLk potentially changes toward the specific voltage VbitH that is lower than voltage VwH. With DRAM 10a, since the bit-line high-level voltage VbitH is lower than word-line high-level voltage VwH (=Vcc), the high-level data voltage at the selected bit line BLk can be written straight into the storage capacitor 14 of a memory cell 12 without forcing the threshold voltage Vth of transfer transistor 16 of the cell to be so deeply lower as in the previously described DRAM 10 of FIG. 1.

The word line driver 18 of FIG. 1 may be modified to include a voltage-booster circuit being additionally provided therein. This circuit may be a bootstrap circuit for receiving the power supply voltage Vcc to increase or boost its potential by a predetermined level ΔVw. The boosted voltage is supplied to the selected word line WLj as the word-line high-level voltage VwH' as shown in FIG. 10. With such an arrangement, it is possible to write the bit line voltage of the high level into the storage capacitor of memory cell 12, with the transfer transistor 16 being allowed to be greater in threshold voltage Vth than that of DRAM 10 of FIG. 1. Even in this case, the threshold voltage of transfer transistor 16 is still lower than that of prior art to attain the same current cut-off characteristic thereof. Therefore, similar technical advantages to those of DRAM 10 can be obtained.

FIG. 11 illustrates the operating characteristic of transfer-gate transistor 16 employed in the above embodiments in comparison with that of the prior art, under the assumption that the channel impurity concentration of transfer transistor is same as each other. The transistor characteristic of the prior art is represented by a dotted line 60. With the present invention, the subthreshold characteristic can be improved by employment of the bit-line low-level voltage VbitL being higher than the source voltage Vss, with the result in the operating characteristic curve being shifted by voltage VbitL as shown by a solid line 62. More specifically, transfer transistor 16 can maintain its turn-off state under such a condition that the gate voltage Vg is lower by voltage VbitL than the voltage at its source region coupled to bit line BLi. This means that the turn-off state of transfer transistor 16 of the present invention is "deeper" than that in the prior art, thereby to enhance the current cut-off capability of transistor 16 while it turns off, accordingly. As a result, even when the threshold voltage Vth decreases by voltage VbitL from a conventionally used threshold voltage level, a required current cut-off characteristic can be attained at the prior art level.

The relation between the bit-line low-level voltage VbitL and the word-line high-level voltage VwH in the above embodiments will be explained with reference to FIGS. 12 and 13, wherein the thickness (Tox) of the gate insulation film of transfer transistor 16 is assumed to be 7 nanometers. The vertical axis of this graph represents the word-line high-level voltage VwH that is required in minimum to write a logic "1" (high-level data at VbitH) into a memory cell capacitor 14 successfully. As previously described, the impurity concentration of transfer transistor 16 of the present invention is arranged to reduce the threshold voltage Vth in accordance with the potential selection of bit-line low-level voltage VbitL. Note in FIG. 12 that a dash-dot line 64 indicates the upper limit determined by the maximum electric field in the gate insulation film of transfer transistor 16.

In the prior art, there is the lower limit in reduction of the threshold voltage Vth of transfer transistor 16 to maintain the current cut-off characteristic at a required level. The lower limit of threshold voltage may be determined by a sub-threshold swing value S and an allowable leak current Ik. Assume that the sub-threshold swing value S is 70 mV/decade, and the allowable leak current Ik is $10^{-15}$ A at room temperature. The threshold voltage Vth may be defined as a gate voltage that is necessary to obtain a drain current Idr of $10^{-6}$ A, and voltage Vth is represented by $$Vth = -(\log_{10} Ik - \log_{10} Idr) \times S. \quad (1)$$

Therefore, threshold voltage Vth in this case may be calculated to be about 0.6 volts.

On the other hand, with the present invention, the employment of the specific bit-line low-level voltage VbitL can break through the conventional lower limit of reduction in the threshold voltage Vth, which may permit an impurity concentration decrease within the channel region of transfer transistor 16. The lower limit of the word-line high-level voltage VwH may be determined by the following equation:

$$VwH = VbitH + Vth(0) + \Delta Vth, \quad (2)$$

where, Vth(0) is an ordinary threshold voltage in the case of "0"-writing, and $\Delta$Vth is a threshold voltage change corresponding to the back bias effect. As is seen from Equation 2, the value of $\Delta$Vth will decrease as the impurity concentration of transfer transistor 16 is decreased by causing bit-line low-level voltage VbitL to be higher than the source voltage Vss. Such $\Delta$Vth decrease may allow word-line high-level voltage VwH to decrease and become lower than the prior art, while maintaining an excellent current cut-off capability as required. Even in a case wherein a difference (VbitH–VbitL) between the high- and low-levels on the bit line corresponding to the actual signal amount of memory cell 12 is constant, if bit-line low-level voltage VbitL is increased, the ordinary threshold voltage Vth(0) can be reduced accordingly. This may result in that word-line high-level voltage VwH is decreased as shown in FIG. 12.

Let's analyze how much the word-line high-level voltage VwH can be decreased in potential by using the increased bit-line low-level voltage VbitL with reference to FIG. 12. Conventionally, the bit-line low-level voltage is simply equal to the source voltage Vss (=0 volts). To obtain the signal amount of 2 volts (=VbitH–VbitL), it should be required that word-line high-level voltage VwH is higher than 3.17 volts. This may be supported by a point "A" in FIG. 12. On the other hand, with the present invention, when bit-line low-level voltage VbitL is increased at 1 volt, for example, it can be seen by a point "B" of FIG. 12 that word-line high-level voltage VwH is allowed to decrease at 2.7 volts while maintaining the same signal amount as the prior art. Assume that the power supply voltage Vcc is 3.3 volts and that the minimum potential level of variable range of voltage Vcc is 3.0 volts. If bit-line low-level voltage VbitL is higher than 1 volt, the resultant signal amount can no longer be 2.0 volts. A dotted line is used in FIG. 12 to indicate such region with respect to the characteristic curve extending between the points A and S. Looking at the characteristic graph of FIG. 12 from a different aspect, it can be seen that the present invention attains much increased signal amount if the same word-line high-level voltage VwH as that of the prior art is employed to cause the reliability to be higher than that of the prior art.

FIG. 13 is a characteristic diagram showing the relation between the bit-line low-level voltage VbitL and the word-line high-level voltage VwH with the channel impurity concentration Na (/cm$^3$) being varied under the assumption that the signal amount, i.e., the high and low level difference of the bit lines (VbitH–VbitL), is 2.0 volts, which is an exemplary case corresponding to one of the three characteristic lines of word-line high-level voltage VwH shown in FIG. 12. In FIG. 13, a straight vertical line 66 shows the upper potential limit of bit-line low-level voltage VbitL. A curve 68 represents the word-line high-level voltage VwH at the lower limit of impurity concentration Na. By designing the internal circuits of the DRAM and the transfer transistor 16 so that an operating point enters a hatched region C of FIG. 13, the signal amount can be held at 2.0 volts without the use of any voltage boosting circuit for the word lines, under the assumption that the power supply voltage Vcc is 3.3 volts and that it may vary in the range between 3.0 and 3.6 volts.

A DRAM 10b of FIG. 14 is similar to that shown in FIG. 1 with an NMOS transistor Q19 being provided additionally and connected in parallel to the sense-amplifier activation transistor Q2, and with the bit-line low-level voltage (VbitL) generator 28 being replaced by a modified circuit 28a. The additional activation transistor Q19 has a drain electrode connected to the common source line 26, a source electrode connected to the source voltage Vss, and a gate electrode, which is supplied with a control signal SEN2 that goes high temporarily at the beginning of an activation period of sense amplifiers 22. In responding to signal SEN2, transistor Q19 turns on causing the potential on line 26 to drop down at source voltage Vss.

As shown in FIG. 15, the bit-line L-level voltage generator 28a includes a reference voltage generating circuit 70 and a current mirror type CMOS differential amplifier circuit 72. Reference voltage generator 70 is a voltage divider circuit consisting of two series-connected resistors R9, R10. CMOS differential amplifier 72 includes a pair of PMOS transistors Q20, Q21 and a pair of NMOS transistors Q22, Q23 acting as current loads. Transistors Q20, Q21 are connected to each other at the source electrodes thereof. The gate electrode of transistor Q20 is connected to the intermediate node of resistors R9, R10, which serves as the output of reference voltage generator 70. The gate of transistor Q21 acts as an output node N7, which is coupled through transistor Q2 to common source line 26 for sense amplifiers 22. Transistors Q22, Q23 are connected together at their source and gate electrodes, which are also connected to transistor Q21 as shown in FIG. 15. A PMOS transistor Q24 is connected between the power supply voltage Vcc and transistors Q20, Q21 to have a source connected to power supply voltage Vcc. An NMOS transistor Q25 is connected between the common source voltage Vss (=0 V) and transistors Q22, Q23. An NMOS transistor Q26 has a gate electrode connected to transistors Q20, Q22, a drain connected to node N7, and a source coupled to source voltage Vss.

With the voltage generator 28a of FIG. 15, reference voltage generator 70 provides a reference voltage at a preselected potential for the increased bit-line L-level voltage VbitL, which is higher than source voltage Vss. CMOS differential amplifier 72 compares voltage VbitL with the potential at output node N7, and controls transistor Q26 so that the bit-line L-level voltage VbitL is developed at node N7 at a required potential level.

The operation of DRAM 10b is as follows. As shown in FIG. 16, when a selected word line WLj rises in potential, a memory cell data is read onto a selected bit-line pair BLk, BLk(bar). Thereafter, the control signal SEP for PMOS sense amplifier unit goes high, and the control signal SEN1 for the NMOS sense amplifier unit goes high, to thereby activate the sense amplifiers 22. At the beginning of the sense amplifier activation period, the control clock signal φt, which is supplied to the sense amplifier transfer-gate transistors Q7, Q8 of FIG. 3, drops down to its low level, causing PMOS sense amplifier circuit 30 and NMOS sense amplifier circuit 32 to be electrically separated from each other. Control signal SEN2 rises potentially, causing the second activation transistor Q19 on the side of NMOS sense amplifier 32 to turn on. At this time, the common source line 26 is forced to be grounded. A small potential difference (see 74 in FIG. 16) between the selected pair of bit lines BLk, BLk(bar), which has been applied to the nodes N3, N4 of NMOS amplifier 32 of FIG. 3, is further amplified. At this time, the potential at node N4 begins to fall from a precharge voltage and decrease below the bit-line low-level voltage VbitL as shown by the numeral 76 in FIG. 16.

Thereafter, the control signal SEN2 drops to its low level, again. The additional activation transistor Q19 of FIG. 14 turns off. Substantially simultaneously, signal φt recovers at its high level, causing PMOS and NMOS sense amplifiers 30, 32 of FIG. 3 to be connected to each other. The potential at high-level side bit line BLk is increased by PMOS sense amplifier 30 toward the power supply voltage Vcc. The low-level side bit line BLk(bar) continues to be at the bit-line low-level voltage VbitL in the same manner as in the DRAM 10 of FIG. 1.

With the DRAM 10b of FIG. 14, it is possible to obtain extra technical advantage that the sense operation can be enhanced in speed, in addition to the advantages as described previously. This can be said because the gate-to-source voltage of the sense amplifier transistor is increased in amplitude up to VbitL+Vcc/2, by forcing the potential on the source line 26 to drop temporarily to the ground potential at the beginning of the sensing operation. This can improve the speed of sensing and amplifying a potential difference read onto the selected bit line pair BLk, BLk(bar), that is, the sense speed.

A DRAM 10c shown in FIG. 17 is similar to DRAM 10b of FIG. 14 with a circuit 50a being added for providing a decreased bit-line high-level voltage VbitH that is lower than the power supply voltage Vcc. The H-level voltage generator 50a employed in this embodiment includes a current-mirror type CMOS differential amplifier circuit 54a, which includes driver PMOS transistors Q27, Q28, load NMOS transistors Q29, Q30, which are connected as shown in FIG. 18. The gate electrode of transistor Q29 is connected to the output node of voltage-divider serving as reference voltage generator 52.

A PMOS transistor Q31 is connected between the power supply voltage Vcc and the source electrodes of transistors Q27, Q28 being coupled together. An NMOS transistor Q32 is connected between the source voltage Vss and the current carrying electrodes of transistors Q29, Q30 being coupled to each other. The gate electrode of transistor Q30 serves as an output node N8 of high-level voltage generator 50a, which is connected through transistor Q1 to the common source line 24 for sense amplifiers 22. A PMOS transistor Q33 has a gate electrode connected to the drain of driver transistor Q27, a source connected to voltage Vcc, and a drain connected to node N8. The circuit configuration and operation of H-level voltage generator 50a is similar to those of the bit-line L-level voltage generator 28a shown in FIG. 15. The voltage changing sequences during the operation of DRAM 10c is shown in FIG. 19, which is similar to that of FIG. 16 with the voltage at node N3 being arranged to rise toward the bit-line H-level voltage VbitH, which is potentially less than the power supply voltage Vcc. With such an arrangement, the advantages of the second and third embodiments of FIGS. 7 and 14 can be obtained in combination.

A DRAM 10d shown in FIG. 20 is similar to that of FIG. 17 with a sense-accelerator PMOS transistor Q34 being added to the common source line 24 for the sense amplifiers 22. Transistor Q34 has a source electrode connected to the power supply voltage Vcc, a drain electrode connected to line 24, and a gate electrode to which a control signal SEP2 is supplied. Signal SEP2 is similar to the control signal SEN2 in that it goes high temporarily at the very beginning of the activation period of sense amplifiers 22. In response to signal SEP2, transistor Q34 turns on forcing the potential on line 24 to rise toward voltage Vcc.

Figure 21:
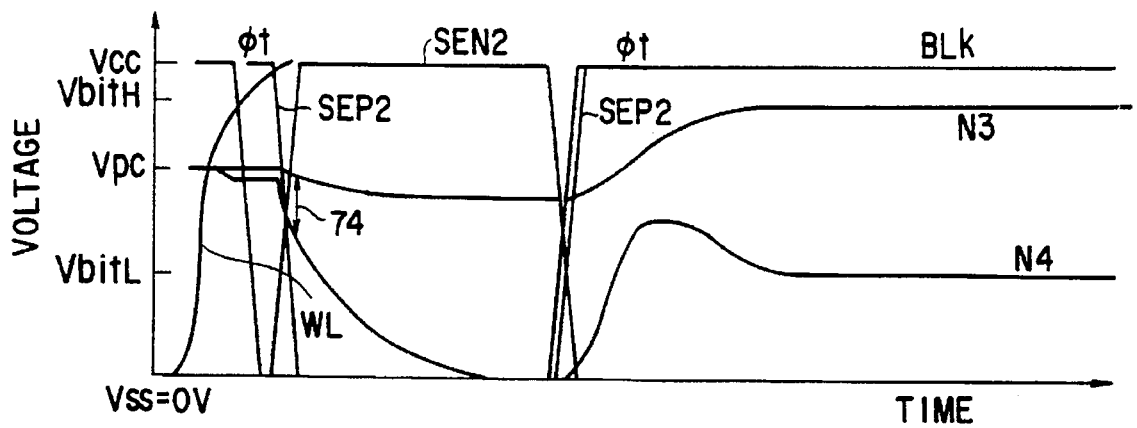
FIG. 21 is an illustration of the voltage changing sequences for the operation of the DRAM of FIG. 20.

The potential variation of the operation voltages in the DRAM 10d is shown in FIG. 21, which is similar to that of FIG. 19. At the beginning of the sense period, the control signal SEN2 goes high, and transistor Q19 turns on. The node N4 (low-level side) of NMOS sense amplifier 32 shown in FIG. 3 drops toward the ground potential Vss. Simultaneously, the control signal SEP2 changes potentially, causing transistor Q34 to turn on. The node N3 (high-level side) of PMOS sense amplifier 30 of FIG. 3 rises potentially toward the power supply voltage Vcc. It is thus possible to shorten the time period required to restore the potential of a bit line on the high-level potential side to the bit-line high-level voltage VbitH, which is generated by H-level voltage generator 50a to be lower than power supply voltage Vcc.

Figure 22:
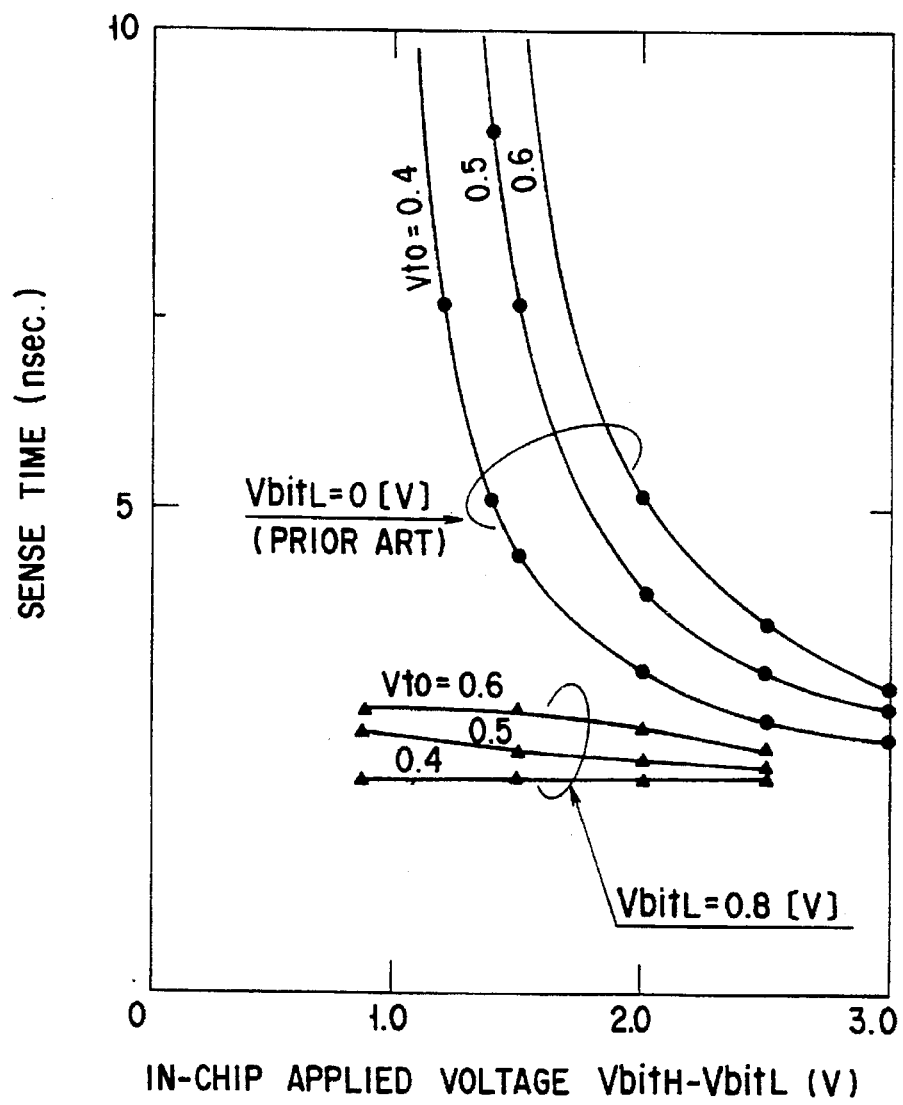
FIG. 22 is a sense characteristic diagram of the embodiments in comparison with a prior art.

FIG. 22 demonstrates that the improved high-speed sense operation is attained by the present invention, by showing the relation between the applied voltage inside the memory chip of the present invention (i.e., the difference between voltages VbitH and VbitL corresponding to the signal amount that can be stored in each memory cell) and the initial sense time, together with that of the prior art. The "initial sense time" may be defined as the time period required for the potential difference between the nodes N3, N4 of FIG. 3 to be amplified by NMOS sense amplifier 32 to expand to have a predetermined amplitude; for example, it is the time elapsed until the expanded bit-line potential difference reaches 20 percent of the total signal amount. In FIG. 22, curves connecting triangular measurement points indicate the sense time characteristics of the present invention, whereas curves connecting round measurement points show the sense time characteristics of the prior art. Both the curves of the invention and those of the prior art may vary as the threshold voltage Vto of sense amplifier transistors changes from 0.4 to 0.6 volts. As is apparent from this graph, in the prior art, when the high/low difference amplitude of a bit line (VbitH−VbitL) decreases below 2.0 volts, the sense time increases at the increased gradient. In contrast, with the DRAMs of this invention using the accelerator transistor Q19, even when the difference "VbitH−VbitL" (i.e., the signal amount) decreases below 1.0 volt, the decrease in the sense time can be compensated for successfully so that the sense time can remain unchanged.

Figure 23:
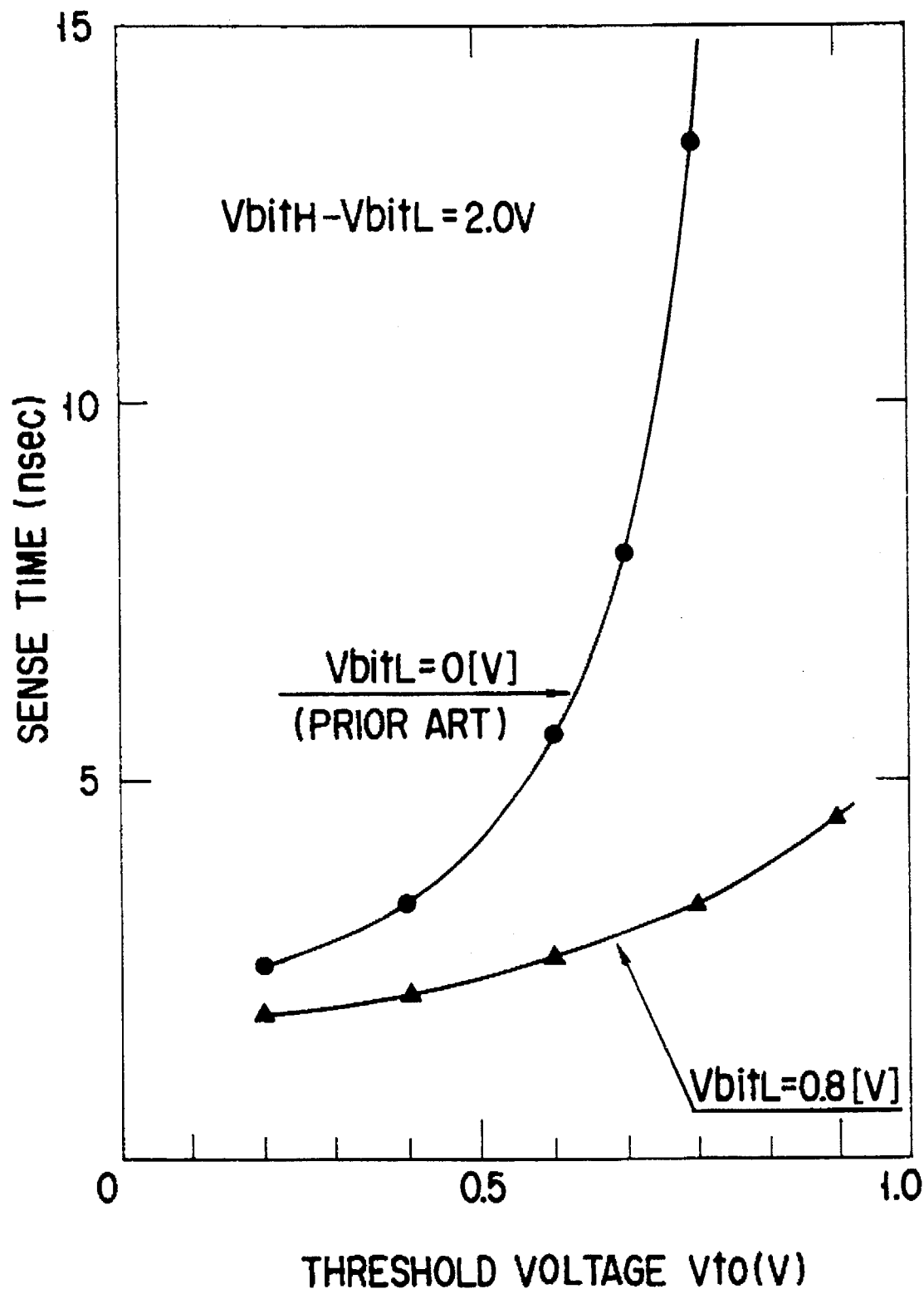
FIG. 23 is a graph showing the threshold voltage versus sense time characteristic of the embodiments together with that of a prior art.

FIG. 23 shows that the sense time may vary as the threshold voltage Vto varies under the assumption that the bit-line high/low difference amplitude (VbitH−VbitL) is constant (2.0 volts in this case). In the prior art, when threshold voltage Vto goes beyond 0.5 volts, the resultant sense time increases remarkably so that the sense speed is remarkably decreased. With the present invention, by contrast, such increase in the sense time can be suppressed. This means that, even if threshold voltage Vto itself is varied extremely due to the manufacturing process of the DRAMs, the sense characteristic can remain substantially "insensitive" to such threshold voltage variation. In other words, the DRAMs of the invention can achieve superior sense characteristic that is independent of the practical manufacturing process conditions.

There may be several modifications for the potential selection of the main voltages. In the DRAMs 10b, 10c and 10d, the high-level voltage applied by word line driver 18 to a selected word line WLj (i.e., the word-line high-level voltage VwH) may be replaced with a boosted voltage Vbst (=Vcc+Va) that is higher than the power supply voltage Vcc, if required. Such boosted voltage may be obtained by a known bootstrap circuit, which is internally arranged in the DRAM. In this case, if the DRAM is assumed for purposes of explanation to be DRAM 10b, the potential on a selected word line WLj varies as illustrated in FIG. 24. The potential variation sequences of FIG. 24 are similar to those shown in FIG. 16 with the word line voltage being so modified as to rise beyond power supply voltage Vcc toward the boosted voltage Vbst. The same goes with DRAMs 10c, 10d. With such an arrangement, the signal amount at each cell capacitor can be further increased.

Alternatively, the word-line high-level voltage VwH may be replaced by a voltage that is lower than the power supply voltage Vcc. In such case, if the DRAM 10b is selected for purposes of explanation only, the word-line voltage rises toward the high-level voltage VwH being lower than the power supply voltage Vcc as shown in FIG. 25. Such potential reduction of voltage VwH may be attained by causing the threshold voltage Vth of transfer transistor 16 to be of a negative polarity, without necessitating any extra circuitry. This can further reduce the voltage applied to the gate insulation film of each transfer transistor 16, to attain the improved operating reliability of the DRAM.

The same discussion may be applied to the DRAM 10c of FIG. 17. In this embodiment, the potential decrease of word-line high-level voltage VwH may be achieved by slightly modifying the circuit configuration of FIG. 17 in such a manner that the output voltage of bit-line high-level voltage generator 50a is supplied to the word line driver 18 as the word-line high-level voltage VwH. With such an arrangement, the writing of a high-level data into a memory cell can be performed while permitting the enhanced reliability. The same goes with the DRAM 10d shown in FIG. 20.

In the DRAMs 10, 10a, 10b, 10c, 10d, the word line driver 18 shown in FIG. 2 may be modified such that the voltage at the source electrode of each NMOS transistor, to which the word-line low-level voltage VwL is applied, is higher than the source voltage Vss, if required. For example, in the case of DRAM 10b of FIG. 14, the output voltage (VbitL) of bit-line low-level voltage generator 28a rather than the voltage Vss is applied as a source voltage to the source electrodes of NMOS transistors of word line driver 18. The potential variation waveforms in this case are illustrated in FIG. 26.

Figure 28:
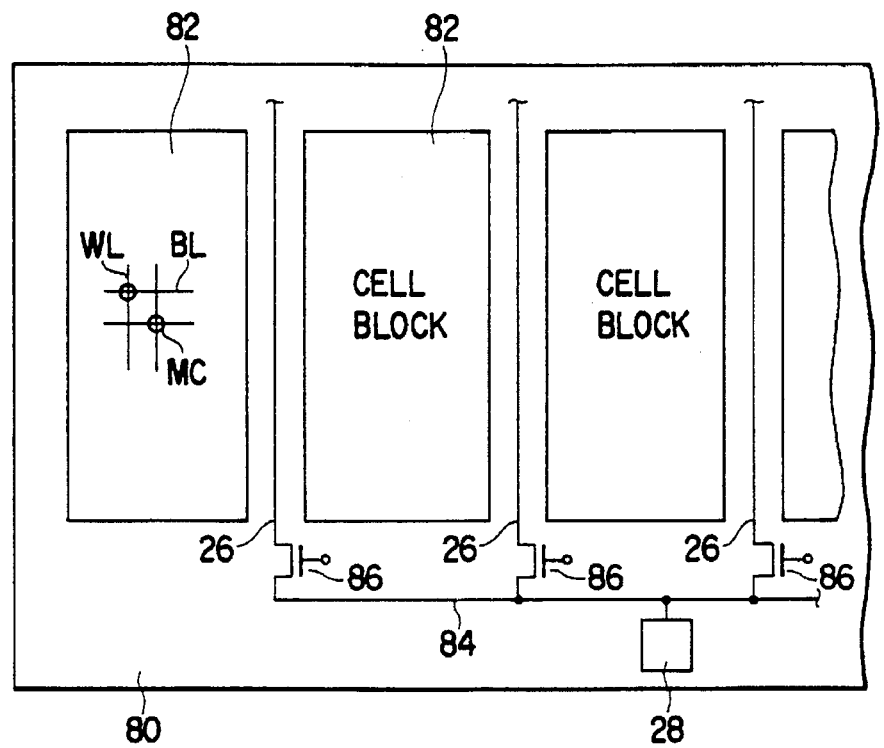
Figure 29:
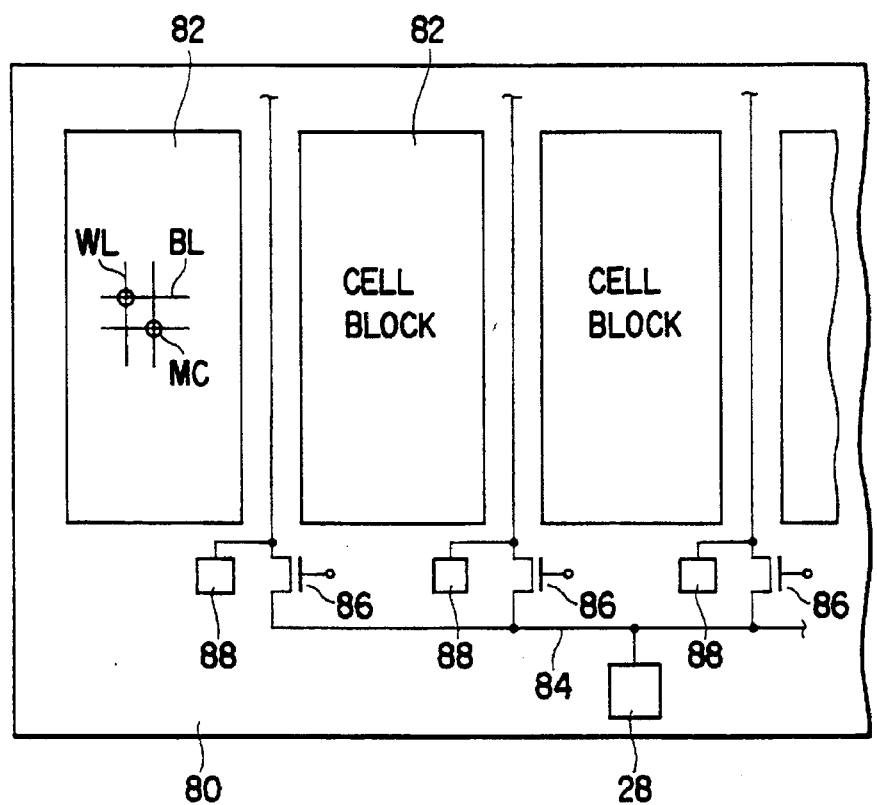

Some layout examples of the bit-line low-level voltage generator circuit 28, 28a on a chip substrate 80 made from silicon are shown in FIGS. 27–29. With the example of FIG. 27, a plurality of memory cell blocks 82 are arranged on substrate 80. Each cell block includes the array of memory cells shown in FIG. 1. A corresponding number of bit-line low-level voltage generators 28 (or 28a) are arranged at corresponding positions in the peripheral area of substrate 80. The common source line 26 of each circuit 28 extends between two adjacent blocks 82. With the layout example shown in FIG. 28, a single L-level generator 28 is provided in common for memory cell blocks 82. Such common L-level generator 28 is connected to a wiring line 84 running in parallel with blocks 82. Line 84 is connected through switching transistors 86 to source lines 26 respectively. With the example shown in FIG. 29, a corresponding number of sub-generators 88 of smaller current drivability are arranged for blocks 82 in addition to the common H-level generator 28. Main generator 28 and sub-generators 88 can be selectively operated in such a manner that, during an amplification operation, only sub-generators 88 are activated, and that main generator 28 of large current drivability is used in the other cases. The layout techniques of FIGS. 27–29 will be also applied to the bit-line high-level voltage (VbitH) generator circuit 50, 50a shown in FIGS. 7, 17 and 20.

Figure 30:
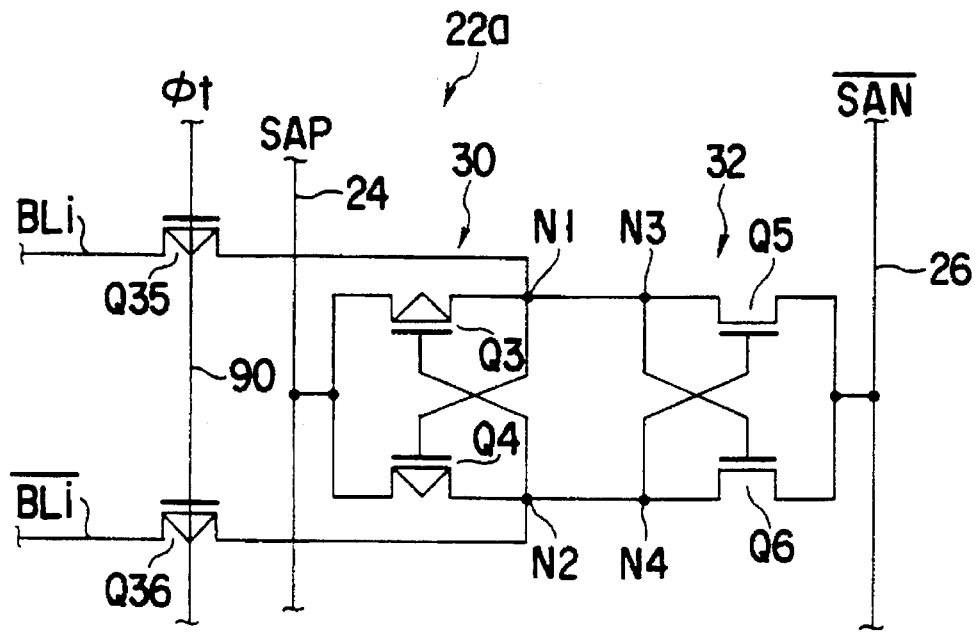
FIGS. 30 and 31 are circuit diagrams of modifications of the sense amplifier shown in FIG. 3.
Figure 31:
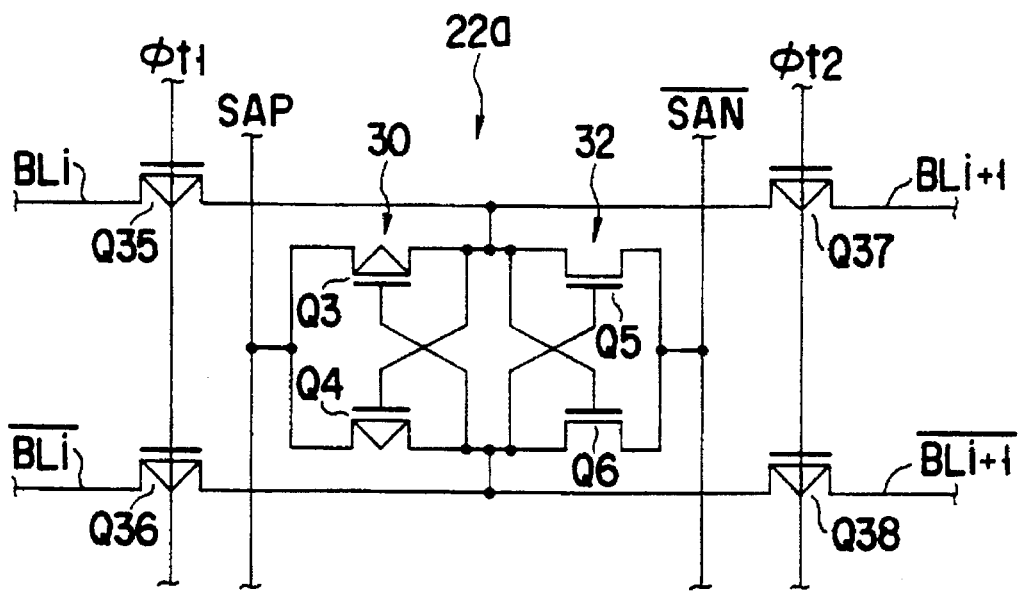

The sense amplifier circuit 22 of FIG. 3 may be modified as shown in FIG. 30. With the modified sense amplifier circuit 22a, the PMOS sense amplifier circuit 30 and the NMOS sense amplifier circuit 32 are directly connected to each other at nodes N1, N3 and nodes N2, N4. Nodes N1, N2 of PMOS sense amplifier 30 are connected through PMOS transistors Q35, Q36 to a corresponding bit line pair BLi, BLi(bar). These transistors Q35, Q36 function as transfer gates. Transistors Q35, Q36 are connected at their gate electrodes to a control clock signal (φt) supply line 90. During the initial sensing period, if the potential rising of the common source line 26 connected to NMOS sense amplifier 32 and the potential rising of the common source line 24 of PMOS sense amplifier 30 are carried out simultaneously, when a bit line pair BLi, BLi(bar) is amplified potentially, the initial sense time, which is required for the potential difference between the bit lines to increase up to a predetermined value, can be shortened to improve the sense speed. Note that the sense amplifier 22a may be further modified as shown in FIG. 31 so that it is used in common to the bit line pair BLi, BLi(bar) and another bit line pair BLi+1, BLi+1(bar) neighboring thereto. In this case, transistors Q37, Q38 are provided as transfer gates for the bit line pair BLi+1, BLi+1(bar).

The above embodiments are employed in a memory system having the precharge voltage Vpc which is a midway potential between the bit-line high-level voltage VbitH and the bit-line low-level voltage VbitL. However, the present invention may also be applied to DRAMs using a different voltage as the precharge voltage Vpc. Furthermore, the bit-line low-level voltage VbitL provided by circuit 28, 28a and/or the bit-line high-level voltage VbitH generated by circuit 50, 50a may be utilized for other peripheral circuits of the DRAMs for different purposes, such as voltages for signal generation.

The embodiments previously described are high in the integration and packing density, so that the power supply voltage Vcc therefor tends to become lower than that of the prior art. The power supply voltage Vcc is usually supplied externally, and may vary in potential due to several reasons. When a low power supply voltage Vcc is used, the performance of DRAMs is influenced by such variation in power supply voltage Vcc. The reasons for this is as follows. As power supply voltage Vcc decreases, bit-line high-level voltage VbitH decreases. This causes the difference between bit-line voltages VbitH, VbitL to decrease, with the result in that the signal amount of memory cell is reduced. Therefore, if power supply voltage Vcc varies, the sense operation for a signal read onto a bit line will be unstable. In the worst case, an operation error will take place.

The rest of the description will be devoted to explanation of some embodiments which can solve various kinds of problems that possibly occur when the power supply voltage Vcc used is lowered potentially.

Figure 32:
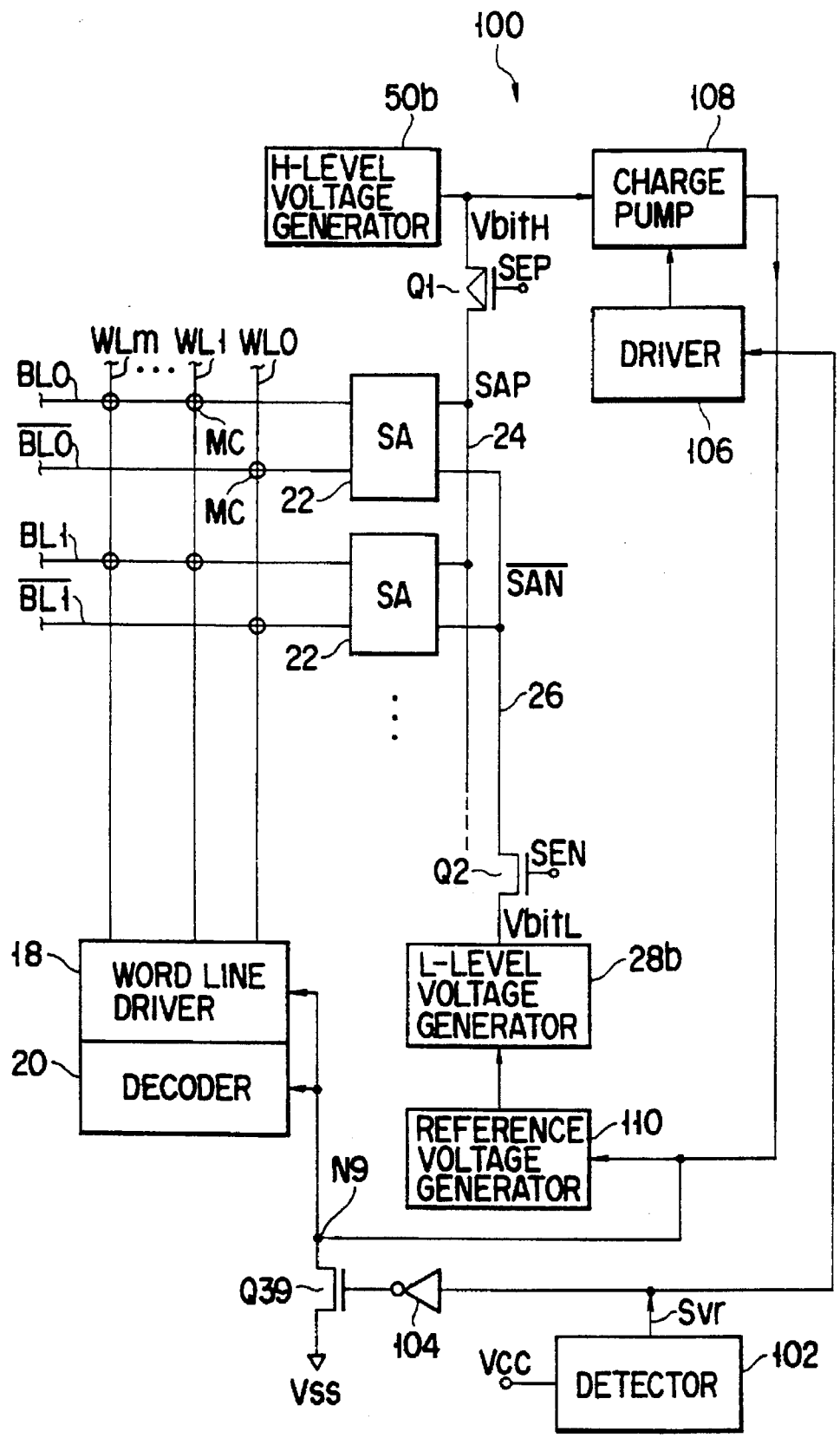
FIG. 32 is a block diagram of a DRAM in accordance with a still another embodiment of the invention.

A DRAM 100 shown in FIG. 32 is similar to DRAM 10a of FIG. 7 with the bit line L- and H-level voltage generators 28 and 50 being replaced by circuits 28b, 50b of different circuit configuration, and with a special compensator circuitry being added which compensates for a variation in the power supply voltage Vcc. A detector circuit 102 is provided to monitor voltage Vcc and detect any occurrence of potential variation in the power supply voltage Vcc. When voltage Vcc decreases in potential, detector 102 generates at its output a detection signal Svr, which is supplied through an inverter 104 to the gate electrode of an NMOS transistor Q39. This transistor has a source electrode connected to the source voltage Vss (the ground potential), and a drain electrode coupled to word line driver 18 and decoder 20.

The output of the Vcc detector 102 is also connected to a driver circuit 106, for driving a charge-pump circuit 108 in response to the variation detection signal Svr. Charge pump 108 is coupled to the output of bit-line H-level voltage generator 50b, and operates using voltage VbitH as its power source voltage. Charge pump 108 has an output connected to a word-line L-level input of word line driver 18, decoder 20, and a circuit 110 for supplying a reference voltage to the bit-line L-level voltage generator 28b. The charge pump output is also connected at a circuit node N9 to the drain of transistor Q39.

As shown in FIG. 33, the H-level voltage generator 50b includes a reference voltage generator 112 consisting of a series circuit of a resistor R11 and an NMOS transistor Q40. Voltage generator 112 is connected between the power supply voltage Vcc and the source voltage Vss. An operational amplifier 114 is provided as a comparator. Amplifier 114 has an inverting input connected to the output of generator 112, which is a common connection node of resistor R11 and the gate and drain of transistor Q40. Generator 112 provides the inverting input of amplifier 114 with a reference voltage Vtn, which is the threshold voltage of transistor Q40. The output of amplifier 114 is connected to the gate of a PMOS transistor Q41, which is series-connected to a series circuit of resistors R12, R13. The common node of these resistors is coupled to the non-inverting input of amplifier 114. The series circuit of transistor Q41 and resistors R12, R13 is connected between voltages Vcc and Vss. Amplifier 114 compares voltage Vtn with a potential at the connection node of resistor R12, R13, which are applied to the inverting and non-inverting inputs of amplifier 114, respectively.

The charge pump 108 includes a plurality of charge storage capacitors C1–C4, which are connected to a series circuit of diode-connected NMOS transistors Q42, Q43, Q44 for one-way sequential charge transfer, which are arranged as shown in FIG. 33. Another diode-connected NMOS transistor Q45 has a source electrode coupled to the output node of bit-line high-level voltage generator 50b, and a drain electrode connected to the first stage capacitor C1. Transistor Q45 performs a charge pumping operation for providing first capacitor C1 with charge carriers supplied from circuit 50b. Capacitors C1–C3 are connected to driver 106, which supplies a first clock signal φ1 to first and third capacitors C1, C3, and a second clock signal φ2 to second capacitor C2. The last stage capacitor C4 is coupled to the source voltage Vss.

The circuit configuration of the bit-line L-level voltage generator 28b is shown in FIG. 34, which is similar to that of FIG. 15 with the reference voltage generator 70 being replaced with circuit 110. This circuit 110 includes a resistor R14 and two diode-connected NMOS transistors Q46, Q47. Transistor Q46 has a source electrode connected to the word-line L-level voltage VwL. The source of transistor Q47 is coupled to the source potential Vss (ground). Resistor R14 and the gate and drain electrodes of transistors Q46, Q47 are connected together at a node N10, which is connected to the gate electrode of PMOS transistor Q20. Resistor R14 generates a constant voltage independently of any possible variation in the power supply voltage Vcc. Transistor Q46 is applied at its drain electrode with a constant voltage corresponding to the threshold voltage of transistor Q47. This means that the reference voltage output node N10 is forced to receive both the output voltage of resistor R14 and a specific voltage supplied by transistor Q46, simultaneously. The specific voltage is represented by VwL+Vt, where Vt is the threshold voltage of transistor Q46. The specific voltage is variable since voltage VwL may vary in response to a variation in the power supply voltage Vcc.

Figure 35:
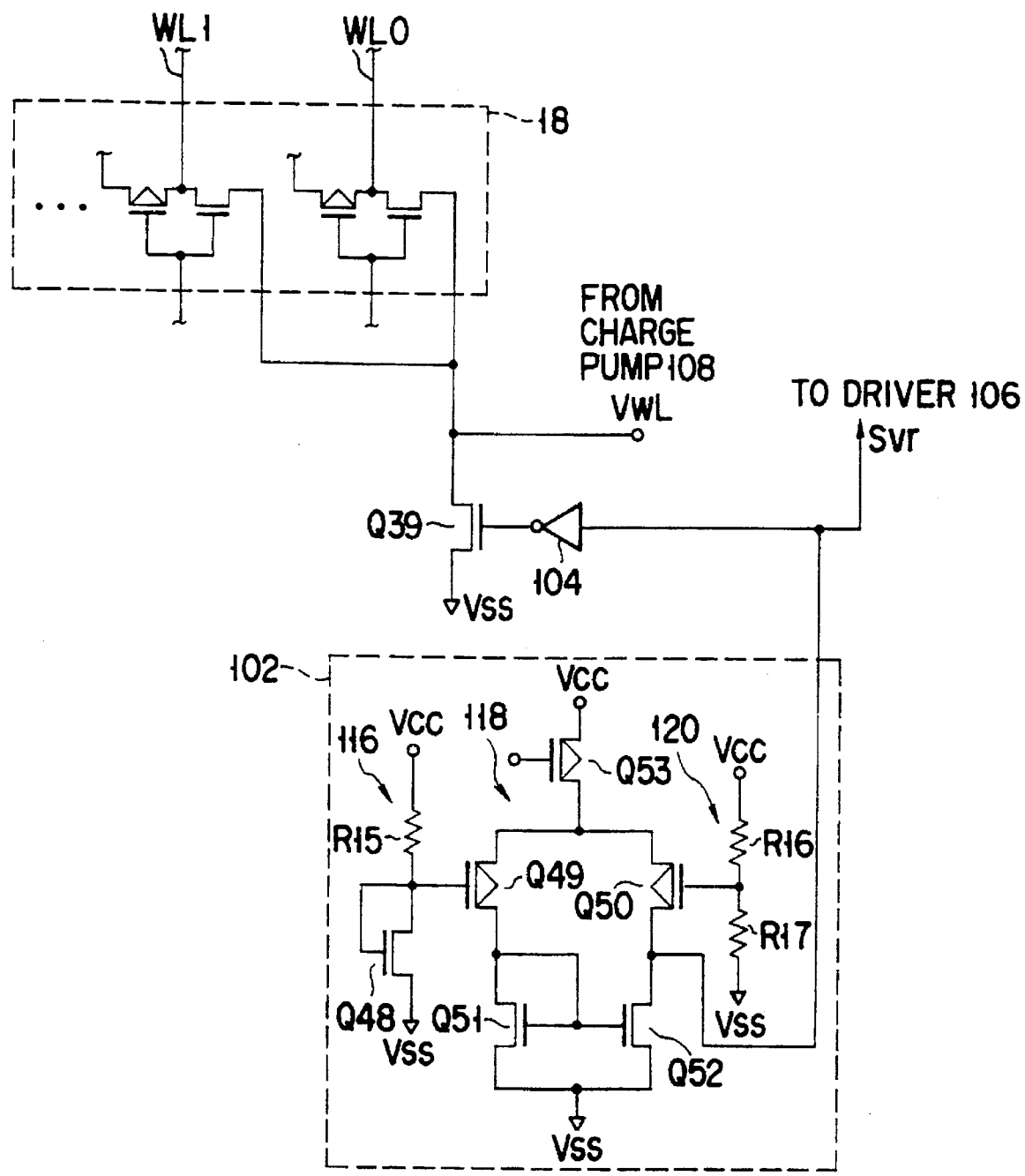

As shown in FIG. 35, the Vcc variation detector 102 includes a reference voltage generator 116, a current-mirror type differential amplifier 118 and a voltage divider 120. Reference voltage generator 116 includes a resistor R15 and a diode-connected NMOS transistor Q48, which are series-connected to each other between the power supply voltage Vcc and the source voltage Vss. Resistor R15 generates a constant voltage independently of variation in voltage Vcc. Differential amplifier 118 includes PMOS driver transistors Q49, Q50 and NMOS current-load transistors Q51, Q52 connected as shown in FIG. 35. A PMOS transistor Q53 is connected between the power supply voltage Vcc and the sources electrodes of transistors Q49, Q50 being connected together. Voltage driver 120 includes a series circuit of resistors R16, R17 connected between the voltages Vcc and Vss. Differential amplifier 118 is supplied with the output voltage of resistor R15, which is insensitive to a variation in the power supply voltage Vcc, the reference voltage output by transistor Q48, and the output voltage of resistor circuit 120 which may vary in accordance with the Vcc variation. Differential amplifier 118 compares these output voltages with one another to generate an L-level voltage when voltage Vcc is higher than a predetermined potential level. In the other cases, amplifier 118 generates an H-level voltage.

The operation of the DRAM 100 is as follows. FIG. 37 shows the waveforms of voltage variations occurring at the main components of DRAM 100 during the operation thereof. The output voltage VbitH of the H-level voltage generator 50b varies in proportion to a potential variation in the power supply voltage Vcc when the voltage Vcc is lower than a predetermined potential level that is denoted by "a" in FIG. 36. While power supply voltage Vcc is higher than the predetermined potential level, voltage VbitH is at a constant potential VcntH as shown in FIG. 36. The constant voltage VcntH may be represented by $$VcntH = Vtn(Q40) \times (R12+R13)/R13, \qquad (3)$$

where Vtn(Q40) is the threshold voltage of NMOS transistor Q40 of FIG. 33. Such bit-line high-level voltage VbitH that is variable in accordance with a variation in voltage Vcc is supplied to the charge pump 108 as its power source voltage. When power supply voltage Vcc falls from the predetermined potential level, charge pump 108 is then set in a condition for generating an output voltage of negative polarity in response to a potential decrease in bit-line high-level voltage VbitH.

While the power supply voltage Vcc is higher than the predetermined potential level, the output of the Vcc variation detector 102 of FIG. 35 is at the low level as previously explained. This low-level output potential is applied through the inverter 104 to the gate electrode of NMOS transistor Q39. This transistor turns on, forcing the L-level terminal of word line driver 18 to be coupled to the ground potential. At this time, charge-pump driver 106 of FIG. 33 is deactivated. When power supply voltage Vcc drops below the predetermined potential level, the output of driver 102 goes high causing NMOS transistor Q39 of FIG. 35 to turn off. Charge-pump driver 106 begins to operate. Driver 106 supplies charge pump 108 with clock pulse signals $\phi 1$, $\phi 2$. Charge pump 108 begins to perform a charge-pumping operation in response to the clock pulse signals, thereby provide the word-line low-level voltage VwL that decreases as power supply voltage Vcc decreases. This voltage VwL is equal to or lower than the ground potential (=Vss), and may vary as voltage VbitH varies as shown in FIG. 36.

The word-line low-level voltage VwL provided by the charge pump 108 is supplied to the source terminal of word line driver 18 as shown in FIG. 35. At this time, the transistor Q39 turns off as described above; therefore, the source terminal voltage of word line driver 18 becomes lower than the ground potential in accordance with potential decrease in the bit-line high-level voltage VbitH. This means that, when power supply voltage Vcc decreases, and when bit-line high-level voltage VbitH decreases proportionally, the word-line low-level voltage VwL to be applied to non-selected word lines is also decreased in potential. The charge pump output voltage VwL is also supplied to the reference voltage generator 110 for bit-line low-level voltage generator 28b; accordingly, the output voltage of voltage generator 28b obtained during this period decreases as both bit-line high-level voltage VbitH and word-line low-level voltage VwL decrease as shown in FIG. 36.

With the embodiment, even when the power supply voltage Vcc of DRAM 100 varies to decrease in potential, the bit-line high-level voltage VbitH, word-line low-level voltage VwL and bit-line low-level voltage VbitL can be automatically decreased in accordance with the variation in voltage Vcc due to the existence of a compensation circuitry including the charge pump 108, thereby enabling the signal amount of memory cell (=VbitH−VbitL) to remain unchanged. The current cut-off characteristic of the memory cell can also be prevented from being degraded. On the other hand, when power supply voltage Vcc varies to increase potentially, voltages VbitH, VbitL are clamped to the constant potentials VcntH, VcntL respectively as shown in FIG. 36. This enables DRAM 100 to attain the improved operating reliability. Furthermore, DRAM 100 can be minimized in a possible increase in the power consumption due to the addition of the Vcc variation compensation circuitry. This can be said because charge pump 108 employed in this embodiment is arranged so that it becomes operative only when power supply voltage Vcc decreases and that it "sleeps" with no power consumption in the other cases. Note here that the initiation point "a" of the power supply voltage variation compensating operation may be shifted to a point "b" or to a point "c" in accordance with various situations. When the compensation initiating point is shifted down to point "b", the deactivation period of charge pump 108 is elongated accordingly, thus enabling the power consumption of DRAM 100 to further decrease.

A DRAM 100a shown in FIG. 38 is similar to that of FIG. 32 with the reference voltage generator 100 being replaced with a circuit 110a, and with the charge pump 108 being replaced by a charge pump circuit 108a. The circuit 110a has an input whereat the output voltage VbitH of the H-level voltage generator 50b is supplied directly as its power source voltage. Circuit 110a includes a series circuit of three diode-connected PMOS transistors Q54–Q56 and a resistor R18, which has a circuit node N11 which serves as the output of circuit 110a connected to the bit-line L-level voltage generator 28b. Circuit 110a generates, at output node N11, a reference voltage which may vary in accordance with variation in the bit-line H-level voltage VbitH. The voltage VbitL is supplied to L-level voltage generator 28b, which then supplies the selected bit line pair with an L-level voltage VbitL that is variable in accordance with a variation in voltage VbitH.

Figure 39:
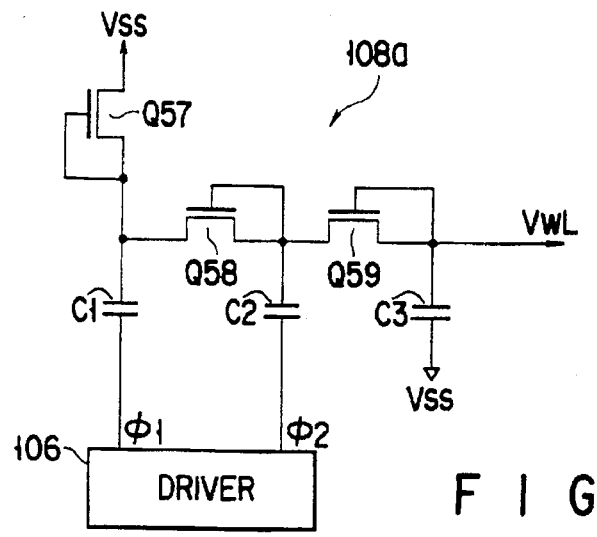
FIG. 39 is a circuit diagram of a charge pump circuit of the DRAM.
Figure 40:
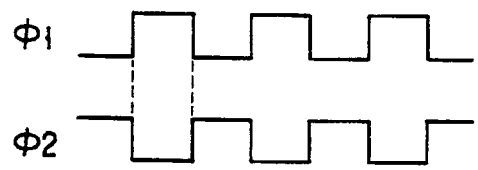
FIG. 40 is a diagram showing the waveforms of clock signals supplied to this charge pump circuit.

As shown in FIG. 39, the charge pump circuit 108 includes an NMOS transistor Q57 having a source electrode connected to the ground potential (=Vss). Charge pump 108 also includes a couple of diode-connected NMOS transistors Q58, Q59. These transistors are connected through capacitors C1, C2 to the driver 106. The drain electrode of transistor Q59 is connected to the ground potential Vss through capacitor C3, and acts as the output of charge pump 108a. Clock signals $\phi 1$, $\phi 2$ are complementary in phase to each other as shown in FIG. 40.

Figure 41:
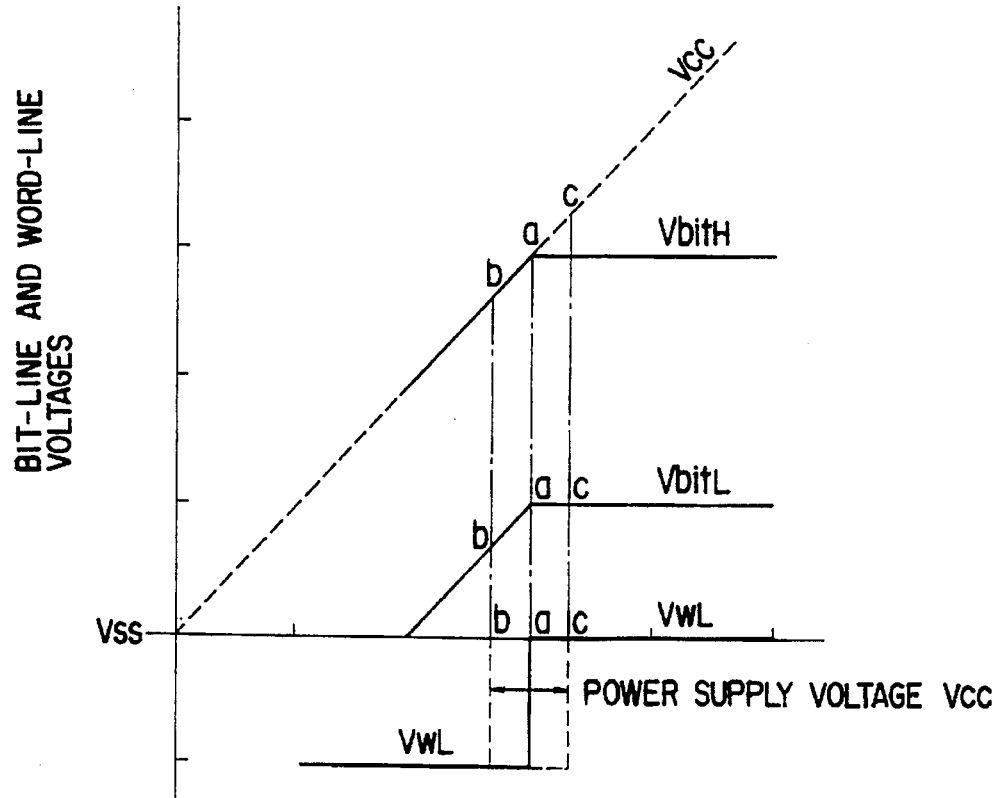
FIG. 41 is a characteristic graph of the power supply voltage compensation experienced in the DRAM of FIG. 38.

When a potential variation of the power supply voltage Vcc is detected by detector 102, driver 106 becomes operative causing charge pump 108a to perform a charge-pumping operation in response to clock signals $\phi 1$, $\phi 2$. Since the source potential of the pumping transistor Q57 is fixed to the ground potential Vss, a predetermined voltage of the negative polarity is generated at the output of charge pump 108a, and then supplied to word line driver 18 and decoder 20 as the word-line L-level voltage VwL. This voltage is constant independently of any potential variation of power supply voltage Vcc as shown in FIG. 41.

While no variation is detected for the voltage Vcc, no clock signals are supplied to charge pump 108a, causing NMOS transistor Q39 of FIG. 38 to turn on so that the word-line L-level voltage VwL is at the ground potential Vss. It is apparent from viewing FIG. 41 that, when voltage Vcc decreases, word-line L-level voltage VwL drops from the ground potential Vss to the negative potential at the compensation starting point "a", while the bit-line H- and L-level voltages VbitH, VbitL vary in accordance with the Vcc variation.

Figure 42:
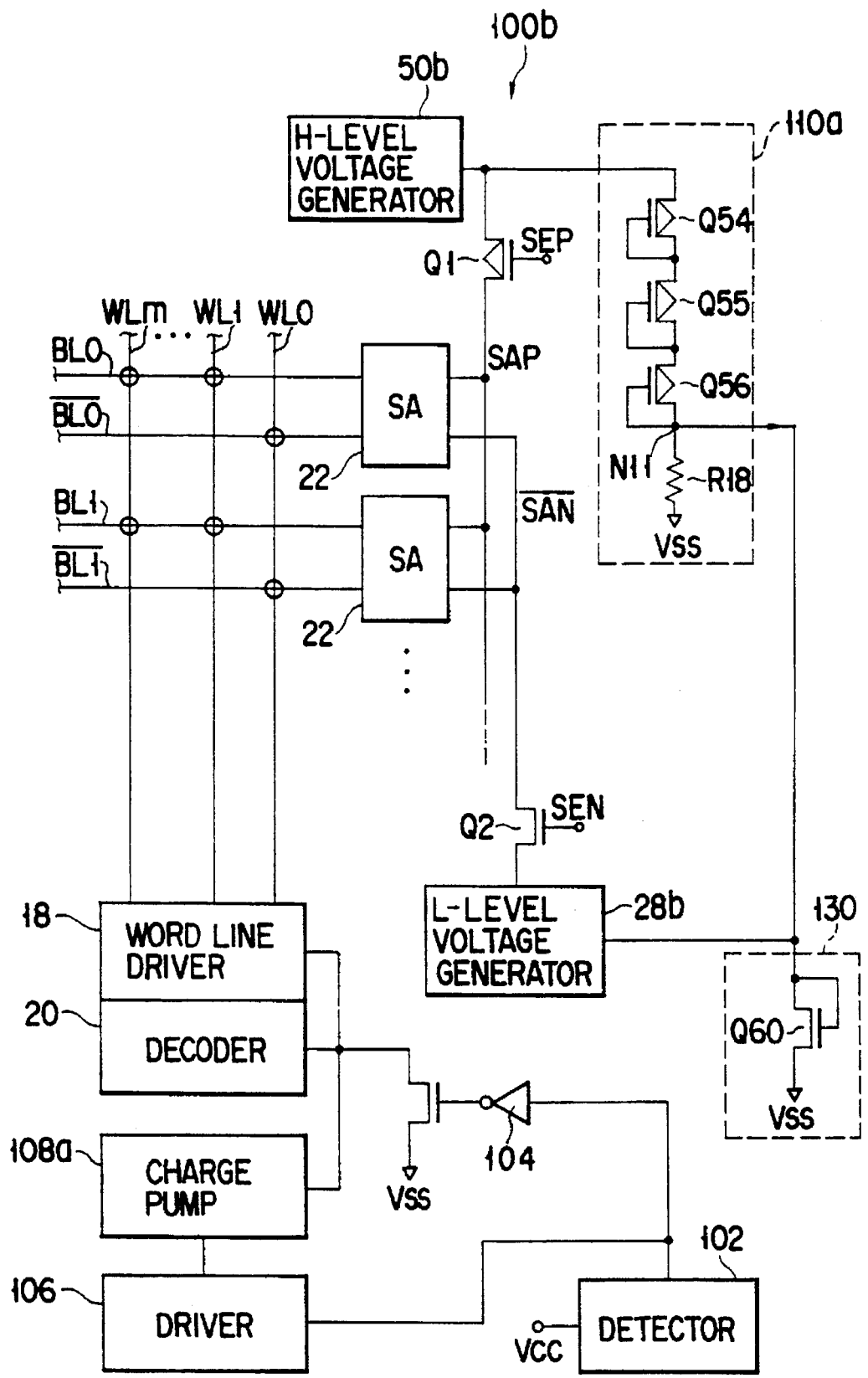

A DRAM 100b of FIG. 42 is similar to that shown in FIG. 38 with another reference voltage generating circuit 130 being added to the bit-line L-level voltage generator 28b. The additional reference voltage generator 130 includes a single diode-connected NMOS transistor Q60 having a source electrode connected to the ground Vss. The gate and drain electrodes of transistor Q60 is connected to generator 28b together with the reference voltage generator 110a.

Figure 43:
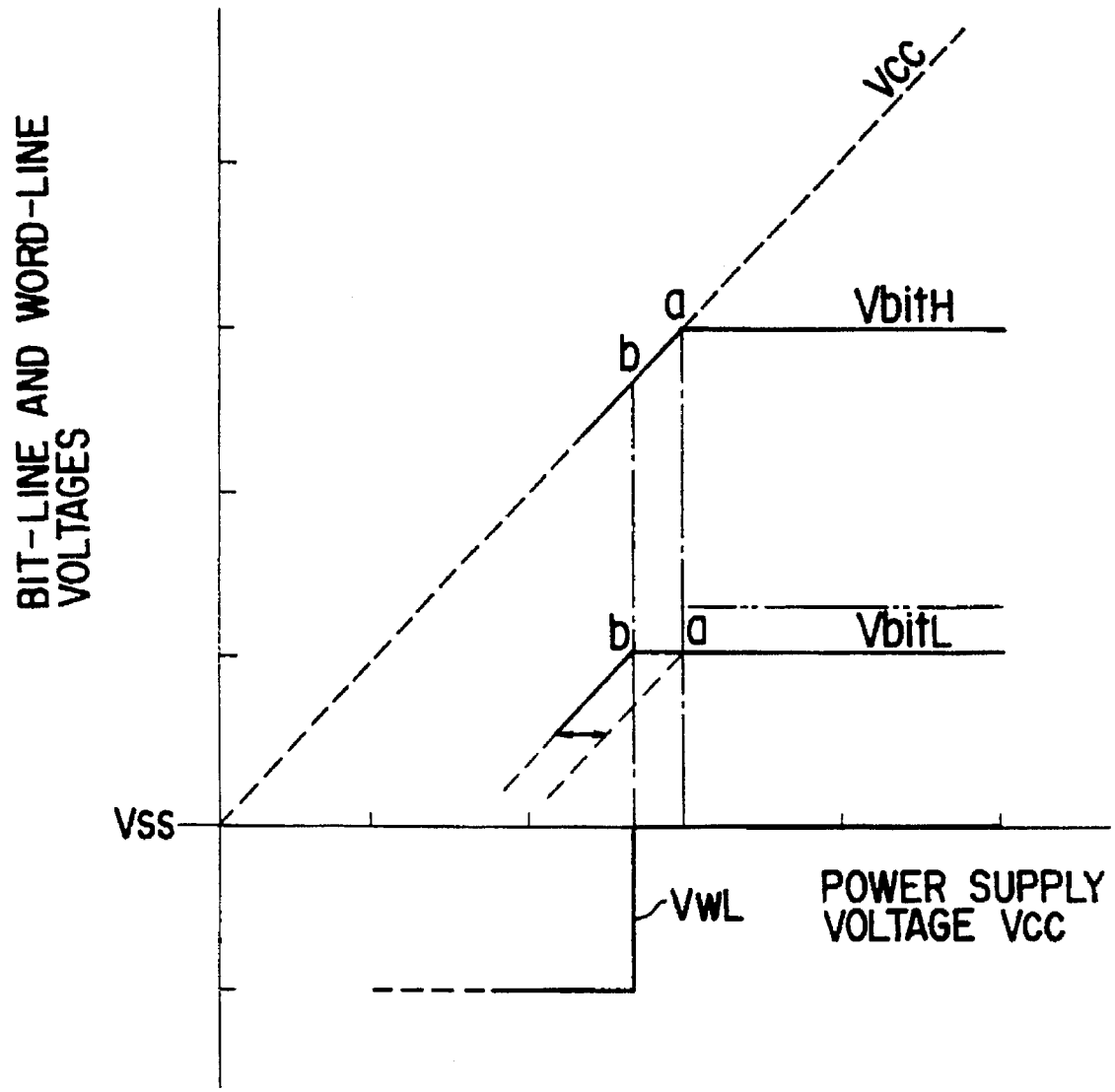
FIGS. 43 and 45 are characteristic graphs of power supply voltage compensation in each of the DRAMs of the preceding figures.

With the DRAM 100b, the bit-line L-level voltage generator 28b is connected to the two reference voltage generators 110a, 130. One of the output voltages of these circuits 110a, 130, which is lower in potential than the other, is used to define the actual potential of the bit-line L-level voltage VbitL. This enables the bit-line H- and L-level voltages VbitH, VbitL to begin to decrease at different time points as shown in FIG. 43. In particular, the total power consumption of DRAM 100b can be further decreased while achieving excellent current cut-off characteristic of transfer gate transistors even when power supply voltage Vcc varies undesirably, by (i) causing the initiation point for potential decrease of bit-line low-level voltage VbitL to fall from "a" to "b", and simultaneously by (ii) causing the initiation point for decrease of the word-line low-level voltage VwL (i.e., operation start point of charge pump 108a) to fall from "a" to "b" within a specific region wherein the decrease in the signal amount (=VbitH–VbitL) is negligible to attain successful sense operations.

Figure 45:
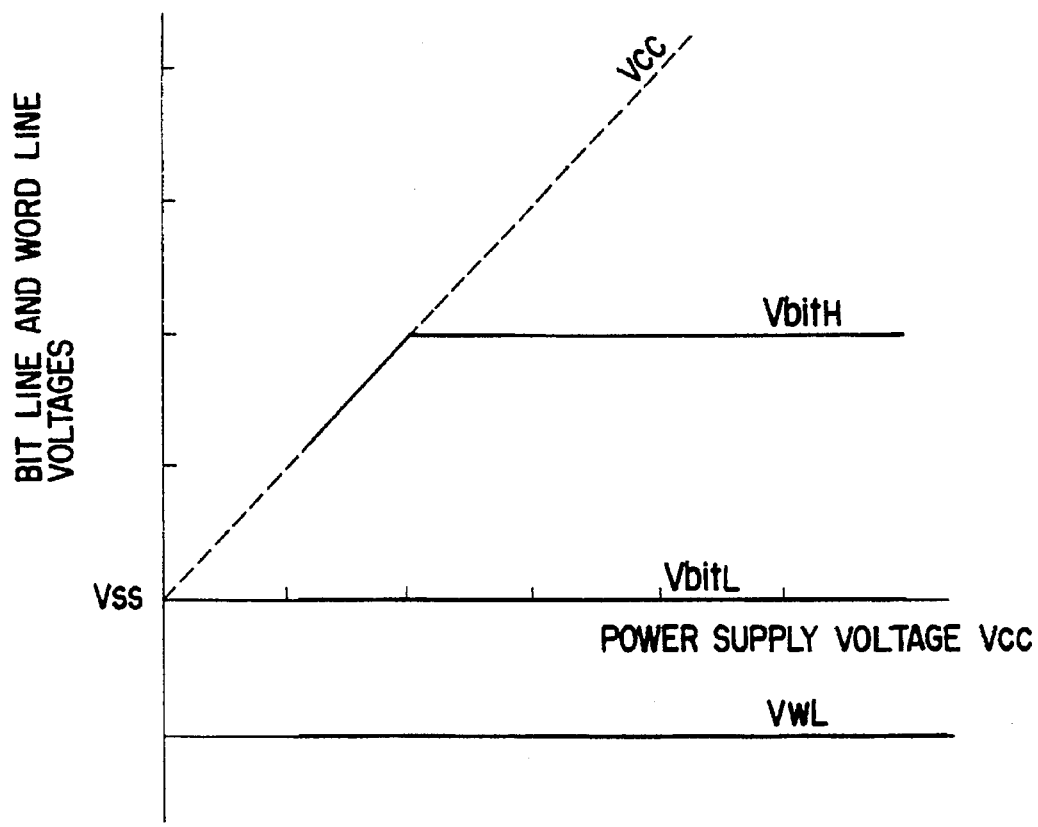

A DRAM 100c of FIG. 44 is similar to that shown in FIG. 38 with the circuits 28b, 102, 110a, inverter 104 and NMOS transistor Q39 being removed to simplify the overall configuration of the DRAM. No bit-line L-level voltage generator is arranged in DRAM 100c, and the bit-line L-level voltage VbitL is connected to the ground potential Vss by way of activation transistor Q2. The word line driver 18 and decoder 20 are supplied by charge pump 108a with the constant voltage of the negative polarity, which is potentially constant irrespective of any potential variation of the power supply voltage Vcc. Driver 106 constantly supplies charge pump 108a with the clock signals $\phi1$, $\phi2$ even when the voltage Vcc varies. The bit-line and word-line voltages versus power supply voltage Vcc characteristic of DRAM 100c is shown in FIG. 45, wherein voltages VbitL, VwL are forced to remain unchanged throughout the whole range of the Vcc variation.

With the embodiment, the bit-line low-level voltage VbitL is always fixed at the ground potential Vss irrespective of any variation in the power supply voltage Vcc. The bit-line low-level voltage generators 28, 28a, 28b employed in the above embodiments are no longer necessary. This can simplify the internal circuit configuration of the DRAM, which leads to achievement of higher integration density. In addition, since word-line low-level voltage VwL to be applied to non-selected word lines is always fixed by charge pump 108a to a preselected potential of negative polarity (see FIG. 45), it becomes possible to reduce the threshold voltage of the transfer gate transistor in a non-selected cell by its reverse bias potential. If the impurity concentration is decreased to reduce the threshold voltage, the threshold level for writing a high-level data into a memory cell can be decreased due to the decrease in the threshold voltage and weakness of the back-bias effect. As a result, effective transfer of signal charge carriers is attainable even when high-level voltage VwH given to a selected word line WLj is decreased, to thereby improve the reliability of the gate insulation film of transfer gate transistor.

Furthermore, the fixation of the bit-line low-level voltage VbitL to the ground potential Vss can allow the bit-line high-level voltage VbitH to decrease while ensuring that the significant signal amount as required is available. This means that, when power supply voltage Vcc reduces, the initiation point at which the bit-line high-level voltage VbitH begins to decrease can be lower than that of the above embodiments. In other words, it is possible to expand the Vcc range for enabling the sense operations to be successful with the necessary signal amount being attained. A resultant DRAM can thus be enhanced in its resistance and withstanding performance against the variation of power supply voltage Vcc.

Figure 46:
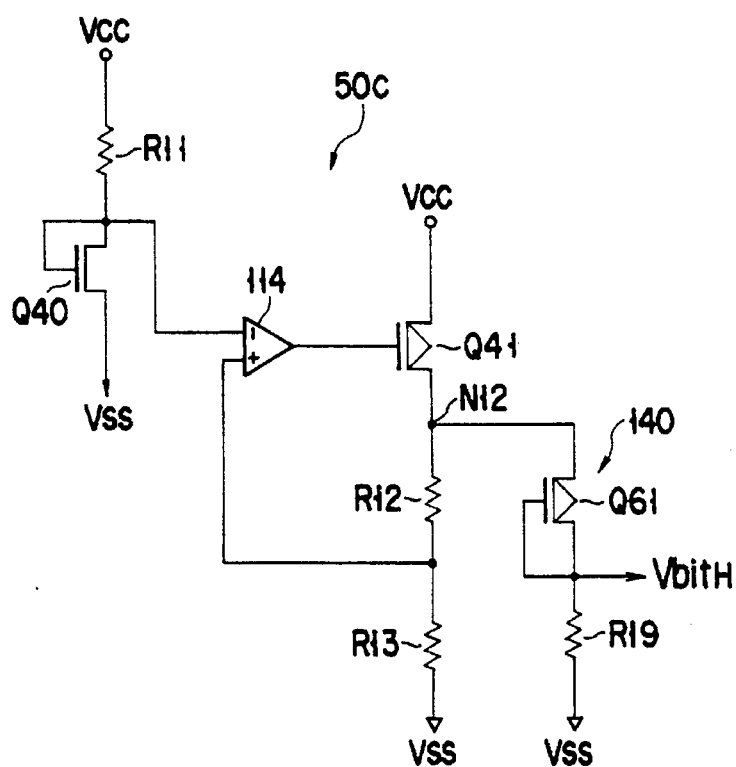
FIG. 46 is a circuit diagram of a modification of the bit-line H-level voltage generator of FIG. 33.

The bit-line high-level voltage generator 50b of FIG. 33 may be modified as shown in FIG. 46, wherein a bit-line high-level voltage generator 50c is added with a level-shift circuit 140. This circuit includes a diode-connected PMOS transistor Q61 and a resistor R19. Level-shift circuit 140 is connected to a node N12 of transistor Q41 and resistor R12. By adding circuit 140, a resultant bit-line high-level voltage VbitH is constantly lower by a level-shift voltage Vsft than the power supply voltage Vcc as shown in FIG. 47. If the word-line high-level voltage VwH is decreased as voltage VbitH decreases, the reliability of transfer gate MOS transistors can be further improved. The DRAM can be simplified in circuit configuration, either by designing the internal circuitry of the DRAM so that the circuit for generating the word-line high-level voltage VwH and that for generating the bit-line high-level voltage VbitH are constituted by a common circuit, or by designing the internal circuitry so that the word-line high-level voltage VwH is taken out from the node N12 of FIG. 46.

The present invention is not limited to the above-described specific embodiments and may be practiced or embodied in still other ways without departing from the spirit or essential character thereof.

What is claimed is:

1. A memory device, comprising:

an array of memory cells arranged in a plurality of memory cell blocks;

bit lines connected to said memory cells; and a plurality of bit-line voltage generators respectively provided for each of said cell blocks and connected to said bit lines;

wherein said plurality of bit-line voltage generators comprise low-level bit-line voltage generators.

2. A memory device as recited in claim 1, wherein said plurality of low-level bit-line voltage generators output a low-level bit-line voltage higher than a source potential of said memory device.

3. A memory device, comprising:

an array of memory cells arranged in a plurality of memory cell blocks;

bit lines connected to said memory cells;

a plurality of bit line voltage generators; and a plurality of switches respectively provided for said plurality of memory cell blocks and coupling said bit-line voltage generator to said bit lines;

wherein said plurality of bit-line voltage generators comprise low-level bit-line voltage generators.

4. A memory device as recited in claim 3, wherein said plurality of low-level bit-line voltage generators output a low-level bit-line voltage higher than a source potential of said memory device.

5. A memory device as recited in claim 3, comprising:

a plurality of sense amplifiers respectively connected to bit lines of each of said memory cell blocks; and a plurality of common source lines respectively provided for each of said memory cell blocks, each of said common source lines respectively connected to said plurality of sense amplifiers of each of said memory cell blocks;

wherein said common source lines are respectively connected to said switches.

6. A memory device as recited in claim 3, wherein:

said memory device is semiconductor memory device;

said memory cell blocks are arranged in a device region of a semiconductor substrate; and said bit-line voltage generator is disposed in a peripheral region of said semiconductor substrate.

7. A memory device as recited in claim 3, further comprising:

a compensator circuit connected to said bit-line voltage generator and outputting a signal in response to a high-level bit-line voltage, wherein a voltage output by said bit-line voltage generator varies in relation to said signal.

8. A memory device as recited in claim 3, wherein said plurality of bit-line voltage generators comprise high-level bit-line voltage generators.

9. A memory device as recited in claim 8, wherein said plurality of high-level bit-line voltage generators output a high-level bit-line voltage lower than a power supply potential of said memory device.

10. A memory device, comprising:

an array of memory cells arranged in a plurality of memory cell blocks;

bit lines connected to said memory cells;

a first bit-line voltage generator;

a plurality of second bit-line voltage generators respectively provided for said plurality of memory cell blocks a plurality of switches respectively provided for said plurality of memory cell blocks and coupling said first bit-line voltage generator to bit lines associated with respective ones of said memory cell blocks.

11. A memory as recited in claim 10, comprising:

a plurality of source lines respectively provided for said plurality of memory cell blocks and connected to said bit lines associated with respective ones of said memory cell blocks; wherein said plurality of second bit-line voltage generators are respectively connected to said plurality of source lines; and said switches respectively connect said plurality of source lines to said first bit-line voltage generator.

12. A memory as recited in claim 10, wherein said first bit-line voltage generator has a higher current drive capability than each of said second bit-line voltage generators.

13. A memory device as recited in claim 10, wherein said first and second bit-line voltage generators each comprise a low-level bit-line voltage generator.

14. A memory device as recited in claim 10, wherein said low-level bit-line voltage generators output a low-level bit-line voltage higher than a source potential of said memory device.

15. A memory device as recited in claim 10, wherein:

said memory device is semiconductor memory device;

said memory cell blocks are arranged in a device region of a semiconductor substrate; and said first and second bit-line voltage generators are disposed in a peripheral region of said semiconductor substrate.

16. A memory device as recited in claim 10, wherein said first and second bit-line voltage generators each comprise a high-level bit-line voltage generator.

17. A memory device as recited in claim 16, wherein said high-level bit-line voltage generators output a high-level bit-line voltage lower than a power supply potential of said memory device.

18. A memory device as recited in claim 10, further comprising:

a compensator circuit connected to said first and second bit-line voltage generators and outputting a signal in response to a high-level bit line voltage, wherein voltages output by said first and second bit-line voltage generators vary in relation to said signal.

19. A memory device as recited in claim 18, wherein said compensator circuit comprises a plurality of compensator circuits respectively connected to said first and second bit-line voltage generators.

20. A memory device, comprising:

an array of memory cells arranged in a plurality of memory cell blocks;

bit-lines connected to said memory cells; and a plurality of bit-line voltage generators respectively provided for each of said cell blocks and connected to said bit lines;

wherein said plurality of bit-line voltage generators comprise high-level bit-line voltage generators.

21. A memory device as recited in claim 20, wherein said plurality of high-level bit-line voltage generators output a high-level bit-line voltage lower than a power supply potential of said memory device.

22. A memory device as recited in any one of claims 1 or 20, comprising:

a plurality of sense amplifiers respectively connected to bit lines of each of said memory cell blocks; and a plurality of common source lines respectively provided for each of said memory cell blocks, each of said common source lines respectively connected to said plurality of sense amplifiers of each of said memory cell blocks;

wherein said bit-line voltage generators are respectively connected to said common source lines.

23. A memory device as recited in any one of claims 1 or 20, wherein:

said memory device is a semiconductor memory device;

said memory cell blocks are arranged in a device region of a semiconductor substrate; and said plurality of bit-line voltage generators are disposed in a peripheral region of said semiconductor substrate.

24. A memory device as recited in any one of claims 1 or 20, further comprising:

a compensator circuit connected to said bit-line voltage generators and outputting a signal in response to a high-level bit-line voltage, wherein voltages output by said bit-line voltage generators vary in relation to said signal.

25. A memory device as recited in claim 24, wherein said compensator circuit comprises a plurality of compensator devices respectively connected to said bit-line voltage generators.

* * * * *